(12) United States Patent
Yajima et al.

(10) Patent No.: US 8,674,208 B2
(45) Date of Patent: Mar. 18, 2014

(54) THERMOELECTRIC GENERATOR, THERMOELECTRIC GENERATION METHOD, ELECTRICAL SIGNAL DETECTING DEVICE, AND ELECTRICAL SIGNAL DETECTING METHOD

(75) Inventors: Masakazu Yajima, Kanagawa (JP); Masayoshi Kanno, Kanagawa (JP); Shinichiro Yamada, Kanagawa (JP)

(73) Assignee: Sony Corporation, Tokyo (JP)

( * ) Notice: Subject to any disclaimer, the term of this patent is extended or adjusted under 35 U.S.C. 154(b) by 372 days.

(21) Appl. No.: 12/958,977

(22) Filed: Dec. 2, 2010

(65) Prior Publication Data

US 2011/0132422 A1 Jun. 9, 2011

(30) Foreign Application Priority Data

Dec. 9, 2009 (JP) .................. P2009-279290
Aug. 31, 2010 (JP) .................. P2010-194001
Oct. 28, 2010 (JP) .................. P2010-241722

(51) Int. Cl.
*H01L 35/34* (2006.01)
*H01L 35/30* (2006.01)
*H01L 35/28* (2006.01)

(52) U.S. Cl.
USPC ............. 136/201; 136/205; 136/211

(58) Field of Classification Search
USPC ............. 136/201, 203, 205, 211, 230
See application file for complete search history.

(56) References Cited

U.S. PATENT DOCUMENTS 5,430,322 A * 7/1995 Koyanagi et al. ........... 257/467
6,100,463 A * 8/2000 Ladd et al. .................. 136/201

2001/0017151 A1 * 8/2001 Tauchi et al. ............... 136/200
2005/0000637 A1   1/2005 Zirker
2005/0045702 A1 * 3/2005 Freeman et al. ............ 228/254
2006/0010798 A1   1/2006 Shaw
2006/0107986 A1 * 5/2006 Abramov et al. ........... 136/204
2007/0002895 A1   1/2007 Chan
2008/0017353 A1   1/2008 Folea
2009/0022555 A1   1/2009 Oehninger et al.

FOREIGN PATENT DOCUMENTS

JP 2000-147161 5/2000
JP 2004-056866 2/2004

OTHER PUBLICATIONS

European Patent Office, Partial European Search Report issued in connection with European Application No. 10015209.9, dated Aug. 21, 2012. (7 pages).
Partial European Search Report dated Aug. 21, 2012 in corresponding European Patent Application No. 10015209.9.
Extended European Search Report dated Dec. 7, 2012 in corresponding European Patent Application No. 10015209.9.

* cited by examiner

*Primary Examiner* — Eli Mekhlin
(74) *Attorney, Agent, or Firm* — K&L Gates LLP

(57) ABSTRACT

A thermoelectric generation method using a thermoelectric generator includes: placing a thermoelectric generator in a temperature-changing atmosphere; drawing to outside a current that is generated due to a temperature difference between first and second support members when the temperature of the second support member is higher than that of the first support member, and that flows from a second thermoelectric conversion member to a first thermoelectric conversion member, using first and second output sections as a positive terminal and a negative terminal, respectively; and drawing to outside a current that is generated due to a temperature difference between the first and second support members when the temperature of the first support member is higher than that of the second support member, and that flows from a fourth thermoelectric conversion member to a third thermoelectric conversion member, using third and fourth output sections as a positive terminal and a negative terminal, respectively.

5 Claims, 19 Drawing Sheets

(EXAMPLE 1)

(EXAMPLE 2)

(EXAMPLE 3)

(EXAMPLE 4)

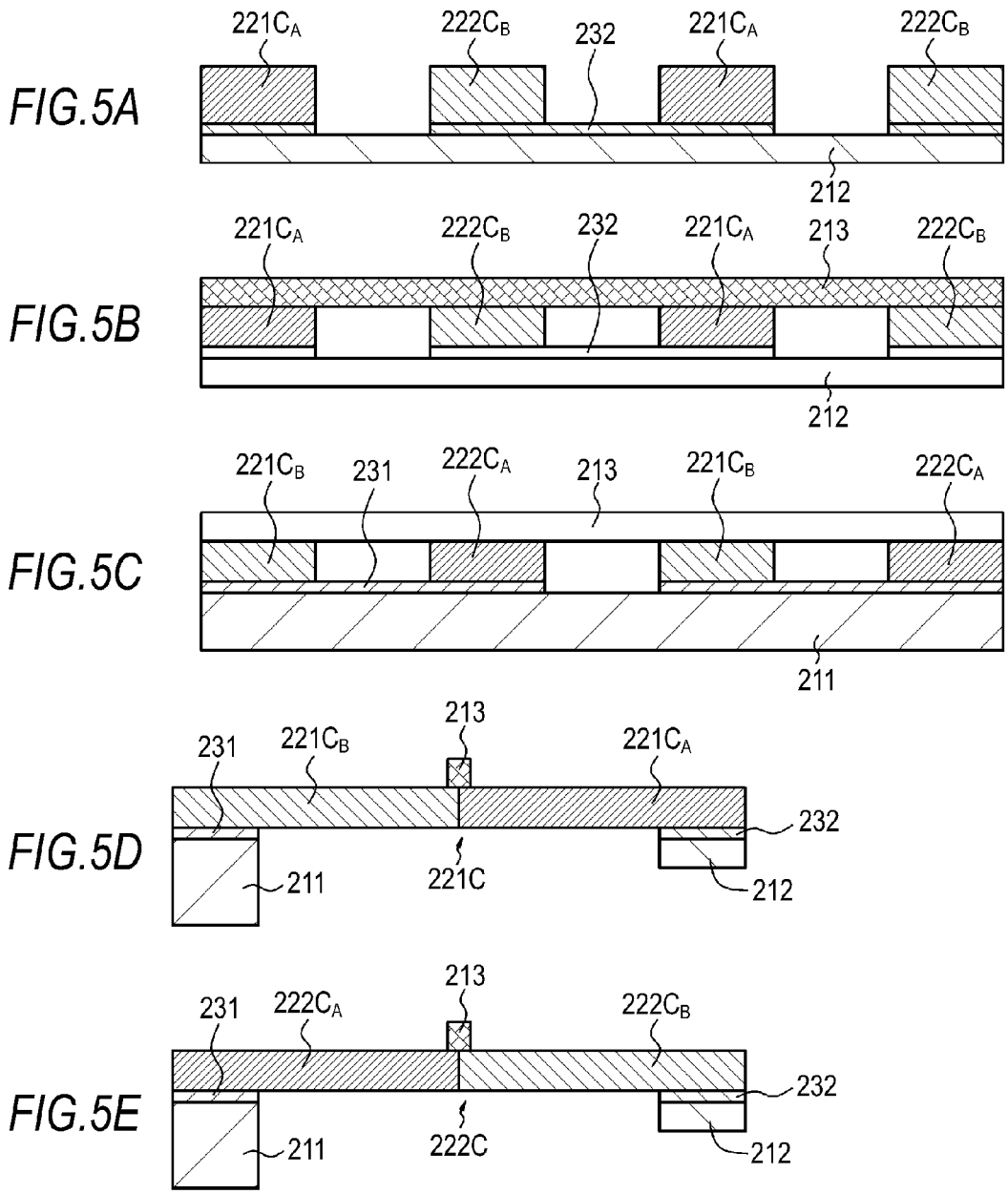

(EXAMPLE 5)

(EXAMPLE 6)

(EXAMPLE 7)

(EXAMPLE 8)

(EXAMPLE 9)

(EXAMPLE 10)

THERMOELECTRIC GENERATOR, THERMOELECTRIC GENERATION METHOD, ELECTRICAL SIGNAL DETECTING DEVICE, AND ELECTRICAL SIGNAL DETECTING METHOD

CROSS REFERENCES TO RELATED APPLICATIONS

The present application claims priority to Japanese Patent Application JP 2009-279290 filed on Dec. 9, 2009; JP 2010-194001 filed on Aug. 31, 2010; and JP 2010-241722 filed on Oct. 28, 2010, the entire contents of which are hereby incorporated by reference.

BACKGROUND

The present disclosure relates to thermoelectric generators, thermoelectric generation methods, electrical signal detecting devices, and electrical signal detecting methods.

Thermoelectric generators that utilize temperature differences include a heat receiver, a heat radiator, and a thermoelectric conversion element disposed between the heat receiver and the heat radiator. For example, portable communications devices (see JP-A-2004-056866) and wrist watches (see JP-A-2000-147161) are known examples of devices using such thermoelectric generators.

SUMMARY

The thermoelectric generator requires temperature differences between the heat receiver and the heat radiator. Thus, for example, thermoelectric generation fails in the absence of temperature differences between the heat receiver and the heat radiator as a result of heat transfer from the heat receiver to the heat radiator through the thermoelectric conversion element. Absent the influx of heat from the heat source into the heat receiver, no electricity is generated in the first place. Thermoelectric generation is therefore difficult when the thermoelectric generator of related art is placed in, for example, an ordinary living environment, specifically, in a room. Further, the thermoelectric generator of related art can constantly effect thermoelectric generation only under limited settings. Constant thermoelectric generation over an ordinary temperature range is particularly difficult.

Sensing devices generally require energy, which is typically supplied from batteries or commercial power sources. Replacement or charging of the batteries is therefore necessary, and, when wired, use of the device is limited. Devices including a power-generating unit that generates electricity from body temperature are available. However, because the sensing device additionally includes the power-generating unit, the device is increased in size or in complexity.

Accordingly, there is a need for a thermoelectric generator, a thermoelectric generation method, an electrical signal detecting device, and an electrical signal detecting method that enable thermoelectric generation without a heat source.

According to First or Second Embodiment, there is provided a thermoelectric generator that includes:

(A) a first support member;
(B) a second support member disposed opposite the first support member;
(C) a thermoelectric conversion element disposed between the first support member and the second support member; and
(D) a first output section and a second output section both of which are connected to the thermoelectric conversion element, wherein the thermoelectric conversion element includes:

(C-1) a first thermoelectric conversion member disposed between the first support member and the second support member; and
(C-2) a second thermoelectric conversion member disposed between the first support member and the second support member, and that is made of a material different from that of the first thermoelectric conversion member, and is electrically connected in series to the first thermoelectric conversion member, the first output section is connected to an end portion of first thermoelectric conversion member on the first support member side, and the second output section is connected to an end portion of the second thermoelectric conversion member on the first support member side.

In the thermoelectric generator according to First Embodiment, the relations $\tau_{SM1} > \tau_{SM2}$, and $S_{12} \neq S_{22}$ are established, where $S_{12}$ is the area of a second surface of the first thermoelectric conversion member in contact with the second support member, provided that $S_{11} > S_{12}$, where $S_{11}$ is the area of a first surface of the first thermoelectric conversion member in contact with the first support member, $S_{22}$ is the area of a second surface of the second thermoelectric conversion member in contact with the second support member, provided that $S_{21} > S_{22}$, where $S_{21}$ is the area of a first surface of the second thermoelectric conversion member in contact with the first support member, $\tau_{SM1}$ is the thermal response time constant of the first support member, and $\tau_{SM2}$ is the thermal response time constant of the second support member.

In the thermoelectric generator according to Second Embodiment, the relations $\tau_{SM1} > \tau_{SM2}$, and $VL_1 \neq VL_2$ are established, where $VL_1$ is the volume of the first thermoelectric conversion member, $VL_2$ is the volume of the second thermoelectric conversion member, $\tau_{SM1}$ is the thermal response time constant of the first support member, and $\tau_{SM2}$ is the thermal response time constant of the second support member.

According to Third Embodiment, there is provided a thermoelectric generator that includes:

(A) a first support member;
(B) a second support member disposed opposite the first support member;
(C) a first thermoelectric conversion element disposed between the first support member and the second support member;
(D) a second thermoelectric conversion element disposed between the first support member and the second support member; and
(E) a first output section and a second output section, wherein the first thermoelectric conversion element includes a first thermoelectric conversion member A in contact with the second support member, and a first thermoelectric conversion member B in contact with the first support member, the first thermoelectric conversion member A and the first thermoelectric conversion member B being disposed in contact with each other, and the second thermoelectric conversion element includes a second thermoelectric conversion member A in contact with the first support member, and a second thermoelectric conversion member B in contact with the second support member, the second thermoelectric conversion member A and the second thermoelectric conversion member B being disposed in contact with each other, wherein the first thermoelectric conversion element and the second thermoelectric conversion element are electrically connected to each other in series, the first output section is connected to an end portion of the first thermoelectric conversion member B, the second output section is connected to an end portion of the second thermoelectric conversion member A, and the relation $\tau_{SM1} \neq \tau_{SM2}$ is established, where $\tau_{SM1}$ is the thermal response time constant of the first support member, and $\tau_{SM2}$ is the thermal response time constant of the second support member.

According to Fourth Embodiment, there is provided a thermoelectric generator that includes:

(A) a first support member;

(B) a second support member disposed opposite the first support member;

(C) a first thermoelectric conversion element disposed between the first support member and the second support member;

(D) a second thermoelectric conversion element disposed between the first support member and the second support member; and (E) a first output section, a second output section, a third output section, and a fourth output section, wherein the first thermoelectric conversion element includes:

(C-1) a first thermoelectric conversion member disposed between the first support member and the second support member; and (C-2) a second thermoelectric conversion member disposed between the first support member and the second support member, and that is made of a material different from that of the first thermoelectric conversion member, and is electrically connected in series to the first thermoelectric conversion member, the second thermoelectric conversion element includes:

(D-1) a third thermoelectric conversion member disposed between the first support member and the second support member; and (D-2) a fourth thermoelectric conversion member disposed between the first support member and the second support member, and that is made of a material different from that of the third thermoelectric conversion member, and is electrically connected in series to the third thermoelectric conversion member, the first output section is connected to the first thermoelectric conversion member, the second output section is connected to the second thermoelectric conversion member, the third output section is connected to the third thermoelectric conversion member, wherein the fourth output section is connected to the fourth thermoelectric conversion member, and the relation $\tau_{SM1} \neq \tau_{SM2}$ is established, where $\tau_{SM1}$ is the thermal response time constant of the first support member, and $\tau_{SM2}$ is the thermal response time constant of the second support member.

According to Fifth Embodiment, there is provided a thermoelectric generator that includes:

(A) a first support member;

(B) a second support member disposed opposite the first support member;

(C) a first thermoelectric conversion element disposed between the first support member and the second support member;

(D) a second thermoelectric conversion element disposed between the first support member and the second support member;

(E) a third thermoelectric conversion element disposed between the first support member and the second support member;

(F) a fourth thermoelectric conversion element disposed between the first support member and the second support member; and (G) a first output section, a second output section, a third output section, and a fourth output section, wherein the first thermoelectric conversion element includes a first thermoelectric conversion member A in contact with the second support member, and a first thermoelectric conversion member B in contact with the first support member, the first thermoelectric conversion member A and the first thermoelectric conversion member B being disposed in contact with each other, the second thermoelectric conversion element includes a second thermoelectric conversion member A in contact with the first support member, and a second thermoelectric conversion member B in contact with the second support member, the second thermoelectric conversion member A and the second thermoelectric conversion member B being disposed in contact with each other, the third thermoelectric conversion element includes a third thermoelectric conversion member A in contact with the second support member, and a third thermoelectric conversion member B in contact with the first support member, the third thermoelectric conversion member A and the third thermoelectric conversion member B being disposed in contact with each other, the fourth thermoelectric conversion element includes a fourth thermoelectric conversion member A in contact with the first support member, and a fourth thermoelectric conversion member B in contact with the second support member, the fourth thermoelectric conversion member A and the fourth thermoelectric conversion member B being disposed in contact with each other, the first thermoelectric conversion element and the second thermoelectric conversion element are electrically connected to each other in series, the third thermoelectric conversion element and the fourth thermoelectric conversion element are electrically connected to each other in series, the first output section is connected to the first thermoelectric conversion element, the second output section is connected to the second thermoelectric conversion element, the third output section is connected to the third thermoelectric conversion element, the fourth output section is connected to the fourth thermoelectric conversion element, and the relation $\tau_{SM1} \neq \tau_{SM2}$ is established, where $\tau_{SM1}$ is the thermal response time constant of the first support member, and $\tau_{SM2}$ is the thermal response time constant of the second support member.

According to First Embodiment, there is provided a thermoelectric generation method that uses the thermoelectric generator of First Embodiment. According to Second Embodiment, there is provided a thermoelectric generation method that uses the thermoelectric generator of Second Embodiment. According to Third Embodiment, there is provided a thermoelectric generation method that uses the thermoelectric generator of Third Embodiment.

The thermoelectric generation methods according to First to Third Embodiments include:

placing the thermoelectric generator in a temperature-changing atmosphere;

drawing to outside a current that is generated due to a temperature difference between the first support member and the second support member when the temperature of the second support member is higher than the temperature of the first support member, and that flows from the second thermoelectric conversion member to the first thermoelectric conversion member, using the first output section as a positive terminal, and the second output section as a negative terminal (the thermoelectric generation methods according to First and Second Embodiments), or that flows from the second thermoelectric conversion element to the first thermoelectric conversion element, using the first output section as a positive terminal, and the second output section as a negative terminal (the thermoelectric generation method according to Third Embodiment).

According to Fourth Embodiment A, there is provided a thermoelectric generation method that uses the thermoelectric generator according to Fourth Embodiment, and includes the steps of:

placing the thermoelectric generator in a temperature-changing atmosphere;

drawing to outside a current that is generated due to a temperature difference between the first support member and the second support member when the temperature of the second support member is higher than the temperature of the first support member, and that flows from the second thermoelectric conversion member to the first thermoelectric conversion member, using the first output section as a positive terminal, and the second output section as a negative terminal; and drawing to outside a current that is generated due to a temperature difference between the first support member and the second support member when the temperature of the first support member is higher than the temperature of the second support member, and that flows from the fourth thermoelectric conversion member to the third thermoelectric conversion member, using the third output section as a positive terminal, and the fourth output section as a negative terminal.

According to Fourth Embodiment B, there is provided a thermoelectric generation method in which, according to the thermoelectric generation method of Fourth Embodiment A, a current that is generated due to a temperature difference between the first support member and the second support member when the temperature of the second support member is higher than the temperature of the first support member, and that flows from the second thermoelectric conversion member to the first thermoelectric conversion member is drawn to outside using the first output section as a positive terminal, and the second output section as a negative terminal, and the current that flows from the fourth thermoelectric conversion member to the third thermoelectric conversion member is drawn to outside using the third output section as a positive terminal, and the fourth output section as a negative terminal, instead of drawing to outside the current that is generated due to the temperature difference between the first support member and the second support member when the temperature of the second support member is higher than the temperature of the first support member, and that flows from the second thermoelectric conversion member to the first thermoelectric conversion member, using the first output section as a positive terminal, and the second output section as a negative terminal, and instead of drawing to outside the current that is generated due to the temperature difference between the first support member and the second support member when the temperature of the first support member is higher than the temperature of the second support member, and that flows from the fourth thermoelectric conversion member to the third thermoelectric conversion member, using the third output section as a positive terminal, and the fourth output section as a negative terminal.

According to Fifth Embodiment A, there is provided a thermoelectric generation method that uses the thermoelectric generator of Fifth Embodiment, and includes:

placing the thermoelectric generator in a temperature-changing atmosphere;

drawing to outside a current that is generated due to a temperature difference between the first support member and the second support member when the temperature of the second support member is higher than the temperature of the first support member, and that flows from the second thermoelectric conversion element to the first thermoelectric conversion element, using the first output section as a positive terminal, and the second output section as a negative terminal; and drawing to outside a current that is generated due to a temperature difference between the first support member and the second support member when the temperature of the first support member is higher than the temperature of the second support member, and that flows from the third thermoelectric conversion element to the fourth thermoelectric conversion element, using the fourth output section as a positive terminal, and the third output section as a negative terminal.

According to Fifth Embodiment B, there is provided a thermoelectric generation method in which, according to the thermoelectric generation method of Fifth Embodiment A, a current that is generated due to a temperature difference between the first support member and the second support member when the temperature of the second support member is higher than the temperature of the first support member, and that flows from the second thermoelectric conversion element to the first thermoelectric conversion element is drawn to outside using the first output section as a positive terminal, and the second output section as a negative terminal, and the current that flows from the fourth thermoelectric conversion element to the third thermoelectric conversion element is drawn to outside using the third output section as a positive terminal, and the fourth output section as a negative terminal, instead of drawing to outside the current that is generated due to the temperature difference between the first support member and the second support member when the temperature of the second support member is higher than the temperature of the first support member, and that flows from the second thermoelectric conversion element to the first thermoelectric conversion element, using the first output section as a positive terminal, and the second output section as a negative terminal, and instead of drawing to outside the current that is generated due to the temperature difference between the first support member and the second support member when the temperature of the first support member is higher than the temperature of the second support member, and that flows from the third thermoelectric conversion element to the fourth thermoelectric conversion element, using the fourth output section as a positive terminal, and the third output section as a negative terminal.

According to First Embodiment, there is provided an electrical signal detecting method that uses the thermoelectric generator of First Embodiment. According to Second Embodiment, there is provided an electrical signal detecting method that uses the thermoelectric generator of Second Embodiment. According to Third Embodiment, there is provided an electrical signal detecting method that uses the thermoelectric generator of Third Embodiment.

The electrical signal detecting methods according to First to Third Embodiments include:

placing the thermoelectric generator in a temperature-changing atmosphere;

drawing to outside a current that is generated due to a temperature difference between the first support member and the second support member when the temperature of the second support member is higher than the temperature of the first support member, and that flows from the second thermoelectric conversion member to the first thermoelectric conversion member, using the first output section as a positive terminal, and the second output section as a negative terminal, the current being drawn as an electrical signal (the electrical signal detecting methods according to First and Second Embodiments), or that flows from the second thermoelectric conversion element to the first thermoelectric conversion element, using the first output section as a positive terminal, and the second output section as a negative terminal, the current being drawn as an electrical signal (the electrical signal detecting method according to Third Embodiment); and obtaining different kinds of electrical signals from the electrical signal.

According to Fourth Embodiment A, there is provided an electrical signal detecting method that uses the thermoelectric generator of Fourth Embodiment, and includes:

placing the thermoelectric generator in a temperature-changing atmosphere;

drawing to outside a current that is generated due to a temperature difference between the first support member and the second support member when the temperature of the second support member is higher than the temperature of the first support member, and that flows from the second thermoelectric conversion member to the first thermoelectric conversion member, using the first output section as a positive terminal, and the second output section as a negative terminal, the current being drawn as an electrical signal; and drawing to outside a current that is generated due to a temperature difference between the first support member and the second support member when the temperature of the first support member is higher than the temperature of the second support member, and that flows from the fourth thermoelectric conversion member to the third thermoelectric conversion member, using the third output section as a positive terminal, and the fourth output section as a negative terminal, the current being drawn as an electrical signal; and obtaining different kinds of electrical signals from the electrical signals.

According to Fourth Embodiment B, there is provided an electrical signal detecting method in which, according to the electrical signal detecting method of Fourth Embodiment A, a current that is generated due to a temperature difference between the first support member and the second support member when the temperature of the second support member is higher than the temperature of the first support member, and that flows from the second thermoelectric conversion member to the first thermoelectric conversion member is drawn to outside as an electrical signal using the first output section as a positive terminal, and the second output section as a negative terminal, and the current that flows from the fourth thermoelectric conversion member to the third thermoelectric conversion member is drawn as an electrical signal using the third output section as a positive terminal, and the fourth output section as a negative terminal, instead of drawing to outside the current that is generated due to the temperature difference between the first support member and the second support member when the temperature of the second support member is higher than the temperature of the first support member, and that flows from the second thermoelectric conversion member to the first thermoelectric conversion member, using the first output section as a positive terminal, and the second output section as a negative terminal, and instead of drawing to outside the current that is generated due to the temperature difference between the first support member and the second support member when the temperature of the first support member is higher than the temperature of the second support member, and that flows from the fourth thermoelectric conversion member to the third thermoelectric conversion member, using the third output section as a positive terminal, and the fourth output section as a negative terminal, and in which different kinds of electrical signals are obtained from the electrical signals.

According to Fifth Embodiment A, there is provided an electrical signal detecting method that uses the thermoelectric generator of Fifth Embodiment, and includes:

placing the thermoelectric generator in a temperature-changing atmosphere;

drawing to outside a current that is generated due to a temperature difference between the first support member and the second support member when the temperature of the second support member is higher than the temperature of the first support member, and that flows from the second thermoelectric conversion element to the first thermoelectric conversion element, using the first output section as a positive terminal, and the second output section as a negative terminal, the current being drawn as an electrical signal; and drawing to outside a current that is generated due to a temperature difference between the first support member and the second support member when the temperature of the first support member is higher than the temperature of the second support member, and that flows from the third thermoelectric conversion element to the fourth thermoelectric conversion element, using the fourth output section as a positive terminal, and the third output section as a negative terminal, the current being drawn as an electrical signal; and obtaining different kinds of electrical signals from the electrical signals.

According to Fifth Embodiment B, there is provided an electrical signal detecting method in which, according to the electrical signal detecting method of Fifth Embodiment A, a current that is generated due to a temperature difference between the first support member and the second support member when the temperature of the second support member is higher than the temperature of the first support member, and the flow from the second thermoelectric conversion element to the first thermoelectric conversion element is drawn to outside as an electrical signal using the first output section as a positive terminal, and the second output section as a negative terminal, and the current that flows from the fourth thermoelectric conversion element to the third thermoelectric conversion element is drawn to outside as an electrical signal using the third output section as a positive terminal, and the fourth output section as a negative terminal, instead of drawing to outside the current that is generated due to the temperature difference between the first support member and the second support member when the temperature of the second support member is higher than the temperature of the first support member, and that flows from the second thermoelectric conversion element to the first thermoelectric conversion element, using the first output section as a positive terminal, and the second output section as a negative terminal, and instead of drawing to outside the current that is generated due to the temperature difference between the first support member and the second support member when the temperature of the first support member is higher than the temperature of the second support member, and that flows from the third thermoelectric conversion element to the fourth thermoelectric conversion element, using the fourth output section as a positive terminal, and the third output section as a negative terminal, and in which different kinds of electrical signals are obtained from the electrical signals.

According to an embodiment, there is provided an electrical signal detecting device that includes at least two of the thermoelectric generators of First to Fifth Embodiments, and in which the current obtained from each thermoelectric generator is obtained as an electrical signal.

Specifically, the electrical signal detecting device according to the embodiment may be of a form including:

(01) at least one thermoelectric generator according to First Embodiment, and at least one thermoelectric generator according to Second Embodiment;

(02) at least one thermoelectric generator according to First Embodiment, and at least one thermoelectric generator according to Third Embodiment;

(03) at least one thermoelectric generator according to First Embodiment, and at least one thermoelectric generator according to Fourth Embodiment;

(04) at least one thermoelectric generator according to First Embodiment, and at least one thermoelectric generator according to Fifth Embodiment;

(05) at least one thermoelectric generator according to Second Embodiment, and at least one thermoelectric generator according to Third Embodiment;

(06) at least one thermoelectric generator according to Second Embodiment, and at least one thermoelectric generator according to Fourth Embodiment;

(07) at least one thermoelectric generator according to Second Embodiment, and at least one thermoelectric generator according to Fifth Embodiment;

(08) at least one thermoelectric generator according to Third Embodiment, and at least one thermoelectric generator according to Fourth Embodiment;

(09) at least one thermoelectric generator according to Third Embodiment, and at least one thermoelectric generator according to Fifth Embodiment; or

(10) at least one thermoelectric generator according to Fourth Embodiment, and at least one thermoelectric generator according to Fifth Embodiment.

Aside from these ten combinations, the electrical signal detecting device may be any of ten combinations selecting three kinds, for example, three thermoelectric generators, any of five combinations selecting four kinds, for example, four thermoelectric generators, or one combination selecting five kinds, for example, five thermoelectric generators from the thermoelectric generators according to First through Fifth Embodiments.

The thermal response time constant $\tau_{SM1}$ of the first support member, and the thermal response time constant $\tau_{SM2}$ of the second support member are different in the thermoelectric generators according to First to Fifth Embodiments, in the thermoelectric generator used for the thermoelectric generation methods according to First to Fifth Embodiments, in the electrical signal detecting methods according to First to Fifth Embodiments, and in the electrical signal detecting device of the embodiment. Thus, a temperature difference occurs between the temperature of the first support member and the temperature of the second support member upon placing the thermoelectric generator in a temperature-changing atmosphere. As a result, thermoelectric generation occurs in the thermoelectric conversion element, the first thermoelectric conversion element, or the second thermoelectric conversion element. Specifically, thermoelectric generation, or generation of an electrical signal is possible without a heat source, provided that there are temperature changes or temperature fluctuations in the environment or atmosphere in which the thermoelectric generator is placed. This enables, for example, remote monitoring or remote sensing in remote places, and enables a power-generating unit to be installed in places where reinstallation is difficult, or in places where placement of wires or interconnections is physically difficult. Further, designing and layout of the power-generating unit can be made more freely.

In the electrical signal detecting methods according to First to Fifth Embodiments, different kinds of electrical signals are obtained from one kind of electrical signal. Further, in the electrical signal detecting device of the embodiment, different kinds of electrical signals are obtained from a single electrical signal detecting device. Further, the electrical signal detecting device itself serves as a power-generating unit. The electrical signal detecting device can thus be reduced in size and complexity, and constant monitoring is possible. The power consumption of the whole system also can be reduced.

Additional features and advantages are described herein, and will be apparent from the following Detailed Description and the figures.

BRIEF DESCRIPTION OF THE FIGURES

FIGS. 5A to 5E are schematic partial cross sectional views of the thermoelectric generator of Example 4 illustrated in FIG. 4, at arrows A-A, B-B, C-C, D-D, and E-E, respectively.

DETAILED DESCRIPTION

Figure 1A:
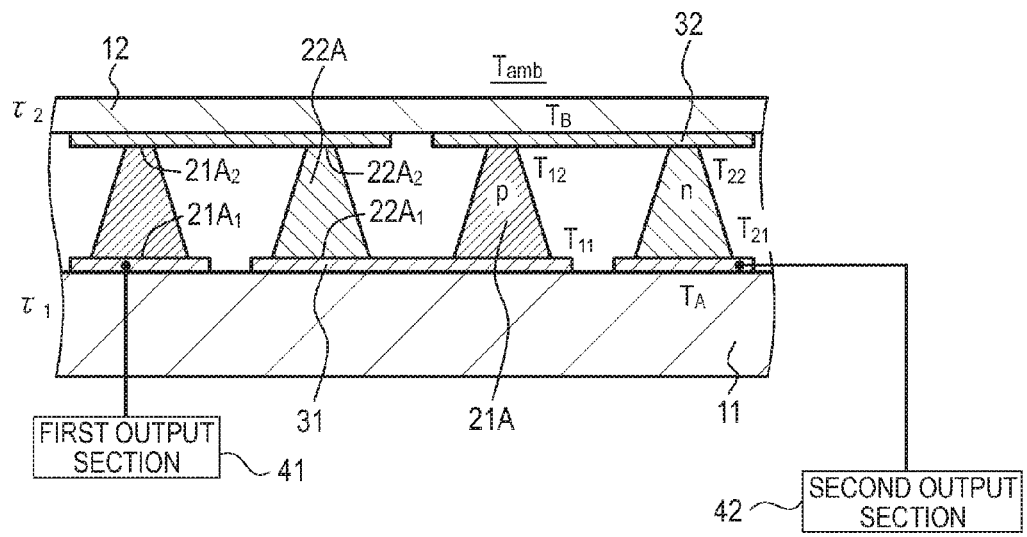
FIG. 1A is a schematic partial cross sectional view of a thermoelectric generator of Example 1.

The following describes the present embodiments based on Examples with reference to the accompanying drawings. It should be noted that the embodiments are not limited to the following Examples, and the numerical values and materials presented in the following Examples are illustrative. Descriptions will be given in the following order.

1. Overall descriptions of thermoelectric generators and thermoelectric generation methods of embodiments
2. Example 1 (thermoelectric generator and thermoelectric generation method according to First Embodiment)
3. Example 2 (thermoelectric generation method according to Second Embodiment, and thermoelectric generator according to First Embodiment)
4. Example 3 (thermoelectric generator and thermoelectric generation method according to Third Embodiment)
5. Example 4 (variation of Example 3)
6. Example 5 (thermoelectric generation method according to Fourth Embodiment A)
7. Example 6 (thermoelectric generation method according to Fourth Embodiment B, and thermoelectric generator according to Fourth Embodiment)
8. Example 7 (variation of Example 6)
9. Example 8 (thermoelectric generation method according to Fifth Embodiment A)
10. Example 9 (thermoelectric generation method according to Fifth Embodiment B, and thermoelectric generator according to Fifth Embodiment)
11. Example 10 (variation of Example 9)
12. Example 11 (variation of Example 2)
13. Example 12 (electrical signal detecting method according to First Embodiment, and electrical signal detecting device according to an embodiment)
14. Example 13 (electrical signal detecting method according to Second Embodiment)
15. Example 14 (electrical signal detecting method according to Third Embodiment)
16. Example 15 (electrical signal detecting method according to Fourth Embodiment A)
17. Example 16 (electrical signal detecting method according to Fourth Embodiment B)
18. Example 17 (electrical signal detecting method according to Fifth Embodiment A)
19. Example 18 (electrical signal detecting method according to Fifth Embodiment B), and other

[Overall Descriptions of Thermoelectric Generator and Thermoelectric Generation Method of Embodiments]

The following concerns a thermoelectric generator for the thermoelectric generation method according to Fourth Embodiment A, and for the electrical signal detecting method according to Fourth Embodiment A; the thermoelectric generator according to Fourth Embodiment, and the electrical signal detecting device of the embodiment using the thermoelectric generator according to Fourth Embodiment.

The thermoelectric generator according to Fourth Embodiment A or the like may be adapted so that:
the first output section is connected to an end portion of first thermoelectric conversion member on the first support member side;
the second output section is connected to an end portion of the second thermoelectric conversion member on the first support member side;
a third output section is connected to an end portion of the third thermoelectric conversion member on the second support member side; and
the fourth output section is connected to an end portion of the fourth thermoelectric conversion member on the second support member side.

The following concerns a thermoelectric generator for the thermoelectric generation method according to Fourth Embodiment B, and for the electrical signal detecting method according to Fourth Embodiment B; the thermoelectric generator according to Fourth Embodiment; and the electrical signal detecting device of the embodiment using the thermoelectric generator according to Fourth Embodiment.

The thermoelectric generator according to Fourth Embodiment B or the like may be adapted so that:
the first output section is connected to an end portion of the first thermoelectric conversion member on the first support member side;
the second output section is connected to an end portion of the second thermoelectric conversion member on the first support member side;
the third output section is connected to an end portion of the third thermoelectric conversion member on the first support member side; and the fourth output section is connected to an end portion of the fourth thermoelectric conversion member on the first support member side.

In the thermoelectric generator of such a preferred configuration according to Fourth Embodiment B or the like, it is preferable that the relation $\tau_{TE1} \neq \tau_{TE2}$ is established, where $\tau_{TE1}$ is the thermal response time constant of the first thermoelectric conversion element, and $\tau_{TE2}$ is the thermal response time constant of the second thermoelectric conversion element.

In this case, the thermoelectric generator may be adapted so that:

the first thermoelectric conversion member has a first surface of area $S_{11}$, and a second surface of area $S_{12}$ ($S_{11} > S_{12}$);

the second thermoelectric conversion member has a first surface of area $S_{21}$, and a second surface of area $S_{22}$ ($S_{21} > S_{22}$);

the third thermoelectric conversion member has a first surface of area $S_{31}$, and a second surface of area $S_{32}$ ($S_{31} < S_{32}$); and the fourth thermoelectric conversion member has a first surface of area $S_{41}$, and a second surface of area $S_{42}$ ($S_{41} < S_{42}$), and that:

the first surfaces of the first thermoelectric conversion member and the second thermoelectric conversion member are in contact with the first support member;

the second surfaces of the first thermoelectric conversion member and the second thermoelectric conversion member are in contact with the second support member;

the first surfaces of the third thermoelectric conversion member and the fourth thermoelectric conversion member are in contact with the first support member; and the second surfaces of the third thermoelectric conversion member and the fourth thermoelectric conversion member are in contact with the second support member.

The first thermoelectric conversion member, the second thermoelectric conversion member, the third thermoelectric conversion member, and the fourth thermoelectric conversion member of such configurations may have the shape of, for example, truncated cones, more specifically, truncated triangular pyramids, truncated quadrangular pyramids, truncated hexagonal pyramids, or truncated circular cones.

In this case, the relations $VL_1 \neq VL_3$, and $VL_2 \neq VL_4$ may be established, where $VL_1$ is the volume of the first thermoelectric conversion member, $VL_2$ is the volume of the second thermoelectric conversion member, $VL_3$ is the volume of the third thermoelectric conversion member, and $VL_4$ is the volume of the fourth thermoelectric conversion member.

The first thermoelectric conversion member, the second thermoelectric conversion member, the third thermoelectric conversion member, and the fourth thermoelectric conversion member of such configurations may be, for example, columnar in shape, more specifically, triangular columns, quadrangular columns, hexagonal columns, or circular columns. Preferably, $VL_1 \neq VL_2$, and $VL_3 \neq VL_4$.

The following concerns a thermoelectric generator for the thermoelectric generation method according to Fifth Embodiment A, and for the electrical signal detecting method according to Fifth Embodiment A; the thermoelectric generator according to Fifth Embodiment; and the electrical signal detecting device according to the embodiment using the thermoelectric generator according to Fifth Embodiment.

The thermoelectric generator according to Fifth Embodiment A or the like may be adapted so that:

the first output section is connected to an end portion of the first thermoelectric conversion member B;

the second output section is connected to an end portion of the second thermoelectric conversion member A;

the third output section is connected to an end portion of the third thermoelectric conversion member A; and the fourth output section is connected to an end portion of the fourth thermoelectric conversion member B.

Alternatively, the following concerns a thermoelectric generator for the thermoelectric generation method according to Fifth Embodiment B, and for the electrical signal detecting method according to Fifth Embodiment B; the thermoelectric generator according to Fifth Embodiment; and the electrical signal detecting device of the embodiment using the thermoelectric generator according to Fifth Embodiment.

The thermoelectric generator of the invention according to Fifth Embodiment B or the like may be adapted so that:

the first output section is connected to an end portion of the first thermoelectric conversion member B;

the second output section is connected to an end portion of the second thermoelectric conversion member A;

the third output section is connected to an end portion of the third thermoelectric conversion member B; and the fourth output section is connected to an end portion of the fourth thermoelectric conversion member A.

In the thermoelectric generator of such a preferred configuration according to Fifth Embodiment B or the like, it is preferable that the relations $\tau_{TE1} \neq \tau_{TE3}$, and $\tau_{TE2} \neq \tau_{TE4}$ are established, where $\tau_{TE1}$ is the thermal response time constant of the first thermoelectric conversion element, $\tau_{TE2}$ is the thermal response time constant of the second thermoelectric conversion element, $\tau_{TE3}$ is the thermal response time constant of the third thermoelectric conversion element, and $\tau_{TE4}$ is the thermal response time constant of the fourth thermoelectric conversion element.

In this case, the thermoelectric generator may be adapted so that the relations $VL_1 \neq VL_3$, and $VL_2 \neq VL_4$ are established, where $VL_1$ is the volume of the first thermoelectric conversion element, $VL_2$ is the volume of the second thermoelectric conversion element, $VL_3$ is the volume of the third thermoelectric conversion element, and $VL_4$ is the volume of the fourth thermoelectric conversion element.

Alternatively, the relations $S_{12} \neq S_{32}$, and $S_{21} \neq S_{41}$, or the relations $S_{12} \neq S_{21}$, and $S_{32} \neq S_{41}$ may be established, where $S_{12}$ is the area of the portion of the first thermoelectric conversion member A in contact with the second support member, $S_{21}$ is the area of the portion of the second thermoelectric conversion member B in contact with the first support member, $S_{32}$ is the area of the portion of the third thermoelectric conversion member A in contact with the second support member, and $S_{41}$ is the area of the portion of the fourth thermoelectric conversion member B in contact with the first support member.

The number of thermoelectric conversion elements forming the thermoelectric generator is essentially arbitrary, and may be decided according to the thermoelectric output required of the thermoelectric generator in the thermoelectric generation methods according to First to Fifth Embodiments B, the electrical signal detecting methods according to First to Fifth Embodiments B, the thermoelectric generators according to First to Fifth Embodiments, and the electrical signal detecting device of the embodiment, including the various preferred configurations described above.

The thermal response time constant $\tau$ is determined by the density $\rho$, specific heat c, and heat-transfer coefficient h of the materials forming the support member, the thermoelectric conversion element, and the thermoelectric conversion member, and the volume VL and area S of the support member, the thermoelectric conversion element, and the thermoelectric conversion member. The value of thermal response time constant increases with use of materials of large density and specific heat and small heat-transfer coefficient, and of large volume and small area. The thermal response time constant $\tau$ can be determined by the following equation (1).

$$\tau = (\rho \cdot c/h) \times (V/S) \qquad (1)$$

In the present embodiment, the thermal response time constant can be measured by creating step-like temperature changes to one end of the thermoelectric generator, and by monitoring the resulting temperature transient response with, for example, an infrared thermometer. Alternatively, the thermal response time constant can be measured by measuring a temperature transition with a thermocouple of sufficiently fast thermal time constant attached to the support member. Further, the thermal response time constant of the thermoelectric conversion element can be obtained by estimating the temperature difference between the upper and lower terminals of the thermoelectric conversion element through monitoring of the output waveform of the thermoelectric generator upon creating similar temperature changes, and by measuring the time for this output voltage to vary from the point of maximum voltage to minimum voltage.

The temperature $\tau_{SM}$ of the support member can be determined from the following equation (2).

$$T_{amb} = \tau_{SM} + \tau_{SM} \times (d\tau_{SM}/dt) \qquad (2),$$

where $T_{amb}$ is the temperature of the atmosphere in which the thermoelectric generator is placed, and $\tau_{SM}$ is the thermal response time constant of the support member.

It is assumed here that temperature changes of the atmospheric temperature $T_{amb}$ are sinusoidal as represented by the following equation (3).

$$T_{amb} = \Delta T_{amb} \times \sin(\omega \cdot t) + A \qquad (3),$$

where $\Delta T_{amb}$ is the amplitude of the temperature change of atmospheric temperature $T_{amb}$, $\omega$ is the angular velocity represented by a value obtained by dividing $2\pi$ by an inverse of temperature change cycle (TM), and A is a constant.

The thermal responses $T_1$ and $T_2$ of the support members having thermal response time constants $\tau_1$ and $\tau_2$ for such temperature changes of atmospheric temperature $T_{amb}$ can be represented by the following equations (4-1) and (4-2).

$$T_1 = \Delta T_{amb}(1+\tau_1^2\omega^2)^{-1} \times \sin(\omega \cdot t + k_1) + B_1 \qquad (4\text{-}1)$$

$$T_2 = \Delta T_{amb}(1+\tau_2^2\omega^2)^{-1} \times \sin(\omega \cdot t + k_2) + B_2 \qquad (4\text{-}2),$$

where
$\sin(k_1) = (\tau_1 \cdot \omega) \cdot (1+\tau_1^2\omega^2)^{-1}$,
$\cos(k_1) = (1+\tau_1^2\omega^2)^{-1}$,
$\sin(k_2) = (\tau_2 \cdot \omega) \cdot (1+\tau_2^2\omega^2)^{-1}$,
$\cos(k_2) = (1+\tau_2^2\omega^2)^{-1}$,
$k_1$ and $k_2$ represent phase lags, and
$B_1$ and $B_2$ are the center temperatures of temperature change.

Figure 19:
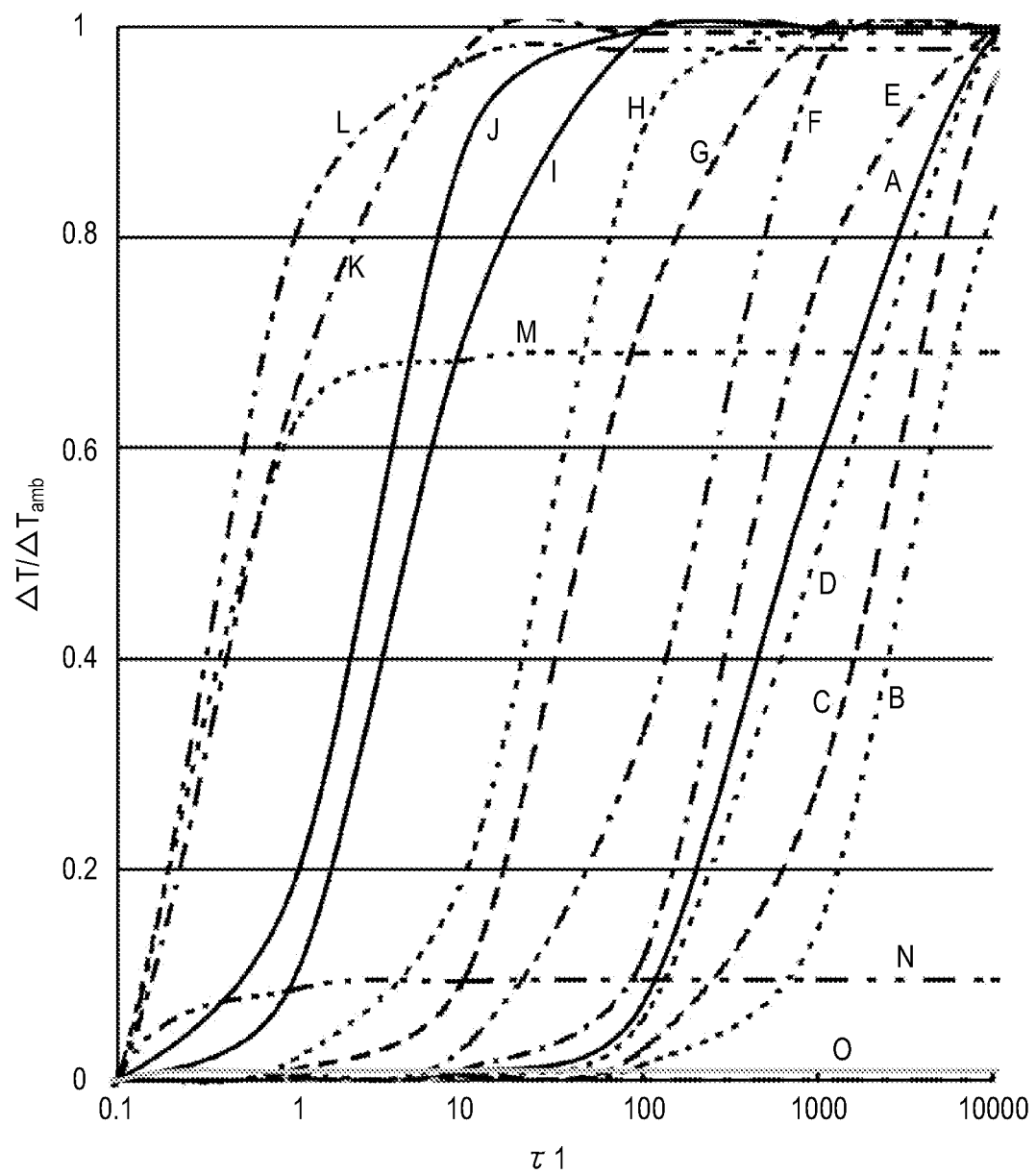
FIG. 19 is a graph representing the simulation results for $\Delta T$ as a function of $\tau_1$ at different values of parameter $\omega$ with $\tau_2$ held constant at 0.1.

Thus, the temperature difference $(\Delta T = T_B - T_A)$ between the temperature $(T_A)$ of the first support member and the temperature $(T_B)$ of the second support member can be approximated from the following equation (5).

$$\Delta T = [\Delta T_{amb} \cdot \omega(\tau_1 - \tau_2)] \times (1+\tau_1^2\omega^2)^{-1} \times (1+\tau_2^2\omega^2)^{-1} \times \sin(\omega \cdot t + \phi) + C \qquad (5),$$

where
$\sin(\phi) = N(M^2 + N^2)^{-1}$,
$\cos(\phi) = M(M^2 + N^2)^{-1}$,
$C = B_1 - B_2$,
$M = \omega(\tau_1^2 - \tau_2^2)$,
$N = \tau_2(1+\tau_1^2\omega^2) - \tau_1(1+\tau_2^2\omega^2)$ FIG. 19 represents the simulation results for $\Delta T$ as a function of $\tau_1$ at different values of parameter $\omega$ with $\tau_2$ held constant at 0.1. The values of $\Delta T$ have been normalized so that the maximum value is 1. The symbols A to O in FIG. 19 each represent temperature change cycle TM, as follows.

| Symbol | TM (min) | Symbol | TM (min) | Symbol | TM (min) | Symbol | TM (min) |
|---|---|---|---|---|---|---|---|
| A | 1,440 | B | 720 | C | 360 | D | 180 |
| E | 90 | F | 30 | G | 10 | H | 5 |
| I | 1 | J | 0.5 | K | 0.1 | L | 0.05 |
| M | 0.01 | N | 0.001 | O | 0.0001 | | |

According to Fourth Embodiment A, Fourth Embodiment B, Fifth Embodiment A, and Fifth Embodiment B, the arrangement of the first thermoelectric conversion element and the second thermoelectric conversion element is essentially arbitrary. For example, the following arrangements are possible. The first thermoelectric conversion element and the second thermoelectric conversion element may be alternately arranged in a single row. A set of a plurality of first thermoelectric conversion elements, and a set of a plurality of second thermoelectric conversion elements may be alternately arranged in a single row. A single row of first thermoelectric conversion elements may be adjoined by a single row of second thermoelectric conversion elements. Plural rows of first thermoelectric conversion elements may be adjoined by plural rows of second thermoelectric conversion elements. The thermoelectric generator may be divided into a plurality of regions, and a plurality of first thermoelectric conversion elements or a plurality of second thermoelectric conversion elements may be arranged in each region.

In the present embodiment, the thermoelectric conversion member may be formed using known materials. Examples include: bismuth-tellurium-based materials (specifically, for example, $Bi_2Te_3$, $Bi_2Te_{2.85}Se_{0.15}$); bismuth.tellurium.antimony-based materials; antimony.tellurium-based materials (specifically, for example, $Sb_2Te_3$); thallium.tellurium-based materials; bismuth.selenium-based materials (specifically, for example, $Bi_2Se_3$); lead.tellurium-based materials; tin.tellurium-based materials; germanium.tellurium-based materials; $Pb_{1-x}Sn_xTe$ compounds; bismuth.antimony-based materials; zinc.antimony-based materials (specifically, for example, $Zn_4Sb_3$); cobalt.antimony-based materials (specifically, for example, $CoSb_3$); iron.cobalt.antimony-based materials; silver.antimony.tellurium-based materials (specifically, for example, $AgSbTe_2$); TAGS (Telluride of Antimony, Germanium and Silver) compounds; Si—Ge-based materials; silicide-based materials [Fe—Si-based materials (specifically, for example, $\beta$-$FeSi_2$), Mn—Si-based materials (specifically, for example, $MnSi_2$), Cr—Si-based materials (specifically, for example, $CrSi_2$), Mg—Si-based materials (specifically, for example, $Mg_2Si$)]; skutterudite-based materials [$MX_3$ compounds (M is Co, Rh, or Ir, and X is P, As, or Sb), and $RM'_4X_{12}$ compounds (R is La, Ce, Eu, Yb, or the like, and M' is Fe, Ru, or Os)]; boron compounds [specifically, for example, $MB_6$ (M is alkali earth metal of Ca, Sr, or Ba, and rare-earth metal such as Y)]; Si-based materials; Ge-based materials; clathrate compounds; Heusler compounds; half-Heusler compounds; rare-earth Kondo semiconductor materials; transition metal oxide-based materials (specifically, for example, $Na_xCoO_2$, $NaCO_2O_4$, $Ca_3CO_4O_9$); zinc oxide-based materials; titanium oxide-based materials; cobalt oxide-based materials; $SrTiO_3$; organic thermoelectric converting materials (specifically, for example, polythiophene, polyaniline); Chromel® alloys; constantan, Alumel® alloys; TGS (triglycine sulfate); $PbTiO_3$; $Sr_{0.5}Ba_{0.5}Nb_2O_6$; PZT; $BaO$—$TiO_2$-based compounds, tungsten bronze ($A_xBO_3$); 15 perovskite-based materials; 24 perovskite-based materials; $BiFeO_3$; and Bi-layered perovskite-based materials. The material of the thermoelectric conversion member may deviate from stoichiometric composition. Of these materials, it is preferable to use bismuth.tellurium-based materials and bismuth.tellurium.antimony-based materials in combination. More specifically, it is preferable to use, for example, bismuth.tellurium.antimony-based materials for the first thermoelectric conversion member, the third thermoelectric conversion member, the first thermoelectric conversion member A, the second thermoelectric conversion member A, the third thermoelectric conversion member A, and the fourth thermoelectric conversion member A, and use, for example, bismuth.tellurium-based materials for the second thermoelectric conversion member, the fourth thermoelectric conversion member, the first thermoelectric conversion member B, the second thermoelectric conversion member B, the third thermoelectric conversion member B, and the fourth thermoelectric conversion member B. In this case, the first thermoelectric conversion member, the third thermoelectric conversion member, the first thermoelectric conversion member A, the second thermoelectric conversion member A, the third thermoelectric conversion member A, and the fourth thermoelectric conversion member A behave as p-type semiconductors, and the second thermoelectric conversion member, the fourth thermoelectric conversion member, the first thermoelectric conversion member B, the second thermoelectric conversion member B, the third thermoelectric conversion member B, and the fourth thermoelectric conversion member B behave as n-type semiconductors. The materials of the first thermoelectric conversion member and the second thermoelectric conversion member may both have the Seebeck effect, or only one of these materials may have the Seebeck effect. Similarly, the materials of the third thermoelectric conversion member and the fourth thermoelectric conversion member may both have the Seebeck effect, or only one of these materials may have the Seebeck effect. The same is the case for the combination of the first thermoelectric conversion member A and the first thermoelectric conversion member B, the combination of the second thermoelectric conversion member A and the second thermoelectric conversion member B, the combination of the third thermoelectric conversion member A and the third thermoelectric conversion member B, and the combination of the fourth thermoelectric conversion member A and the fourth thermoelectric conversion member B.

Examples of methods of manufacture of the thermoelectric conversion members and thermoelectric conversion elements, and examples of methods for rendering desired shapes to the thermoelectric conversion member and the thermoelectric conversion element include: cutting the ingot of the material forming the thermoelectric conversion member, etching the material of the thermoelectric conversion member, molding with a mold, deposition by plating, a combination of PVD or CVD method with a patterning technique, and a liftoff method.

Examples of materials of the first support member and the second support member include: fluororesin; epoxy resin; acrylic resin; polycarbonate resin; polypropylene resin; polystyrene resin; polyethylene resin; thermoset elastomer; thermoplastic elastomer (silicon rubber, ethylene rubber, propylene rubber, chloroprene rubber), latent heat storage material exemplified by normal paraffin, chemical heat storage material, vulcanized rubber (natural rubber); glass; ceramic (for example, $Al_2O_3$, MgO, BeO, AlN, SiC, $TiO_2$, earthenware, porcelain); carbon material such as diamond-like carbon (DLC) and graphite; wood; various metals [for example, copper (Cu), aluminum (Al), silver (Ag), gold (Au), chromium (Cr), iron (Fe), magnesium (Mg), nickel (Ni), silicon (Si), tin (Sn), tantalum (Ta), titanium (Ti), tungsten (W), antimony (Sb), bismuth (Bi), tellurium (Te), and selenium (Se)]; alloys of these metals; and copper nanoparticles. These materials may be appropriately selected and combined to form the first support member and the second support member. For improved heat-transfer efficiency, for example, a fin or a heatsink may be attached to the outer surfaces of the first support member and the second support member, or the outer surfaces of the first support member and the second support member may be roughened or provided with irregularities.

The latent heat storage material is a material which stores latent heat exchanged with the outside at the time of its change of phase or phase transition as thermal energy. The above-mentioned normal paraffin (for example, n-tetradecane, n-pentadecane, n-hexadecane, n-heptadecane, n-octadecane, n-nonadecane, n-icosane and the like) causes change of phase even at room temperature according to the composition thereof. By using such latent heat storage material, as a heat storage, as the first support member or the second support member or a part of the first support member or the second support member, a structure with larger heat capacity can be implemented in a small volume. Accordingly, the thermoelectric conversion element in the thermoelectric generator can be miniaturized and low-profiled. Further, since the latent heat storage material hardly changes in temperature, it can be used as a material constituting the thermoelectric conversion element receiving temperature fluctuation in a long cycle. For example, a heat of fusion of epoxy resin is 2.2 kj/kg, whereas a heat of fusion of normal paraffin having a melting point of 25° C. is 85 kj/kg. Accordingly, normal paraffin can store heat 40 times higher than that of epoxy resin. The chemical heat storage material utilizes heat of chemical reaction of the material and examples thereof include $Ca(OH)_2/CaO_2+H_2$ and $Na_2S+5H_2O$.

The serial electrical connection between the first thermoelectric conversion member and the second thermoelectric conversion member, between the third thermoelectric conversion member and the fourth thermoelectric conversion member, between the first thermoelectric conversion element and the second thermoelectric conversion element, and between the third thermoelectric conversion element and the fourth thermoelectric conversion element may be made by providing an electrode on the support member. However, the electrode is not necessarily required. Essentially any material can be used for the electrode, as long as it is conductive. For example, an electrode structure as the laminate of a titanium layer, a gold layer, a nickel layer formed in this order from the thermoelectric conversion member or thermoelectric conversion element side can be formed. In terms of thermoelectric generator structure and simplicity, it preferable that part of the electrode serves as an output section. In some cases, an extension of the thermoelectric conversion member or the thermoelectric conversion element may form the electrode.

The thermoelectric generator may be sealed with, for example, an appropriate resin. The first support member or the second support member may be provided with the heat storage. The thermoelectric conversion members or the thermoelectric conversion elements may be spaced apart without any filling, or the space between these members or elements may be filled with an insulating material.

The present embodiments are applicable to any technical field that involves thermoelectric generation in a temperature-changing atmosphere. Specific examples of such technical fields or devices suited for integration of the thermoelectric generator include: remote control units for operating various devices such as television receivers, video recorders, and air conditioners; various measurement devices (for example, measurement devices for monitoring soil conditions, and measurement devices for monitoring weather and meteorological conditions); remote monitoring devices and remote sensing devices for remote places; portable communications devices; watches; measurement devices for obtaining biological information such as the body temperature, blood pressure, and pulse of the human body, animals, livestock, and pets, and devices for detecting and extracting various kinds of information based on such biological information; power supplies for charging secondary batteries; power-generating units using the exhaust heat of automobiles; battery-less radio systems; sensor nodes of wireless sensor networks; tire pressure monitoring systems (TPMS); remote control units and switches for operating illuminations; systems that operate in synchronism with input signals by using temperature information as input signal, or as input signal and energy source; and power supplies for portable music players and hearing aids, and for the noise canceling system of portable music players. The present invention is very suitable for places where reinstallation of a power-generating unit is difficult once it has been installed, or in places where placement of wires or interconnections is physically difficult. When attached to machines or constructions, the electrical signal detecting device can be used to detect abnormalities based on cyclic temperature changes created in the machine or construction. Further, the electrical signal detecting device may be used to self-generate power by being attached to keys or cellular phones, in order to construct a system in which the positional information of these items can be transmitted intermittently.

EXAMPLE 1

Figure 1B:
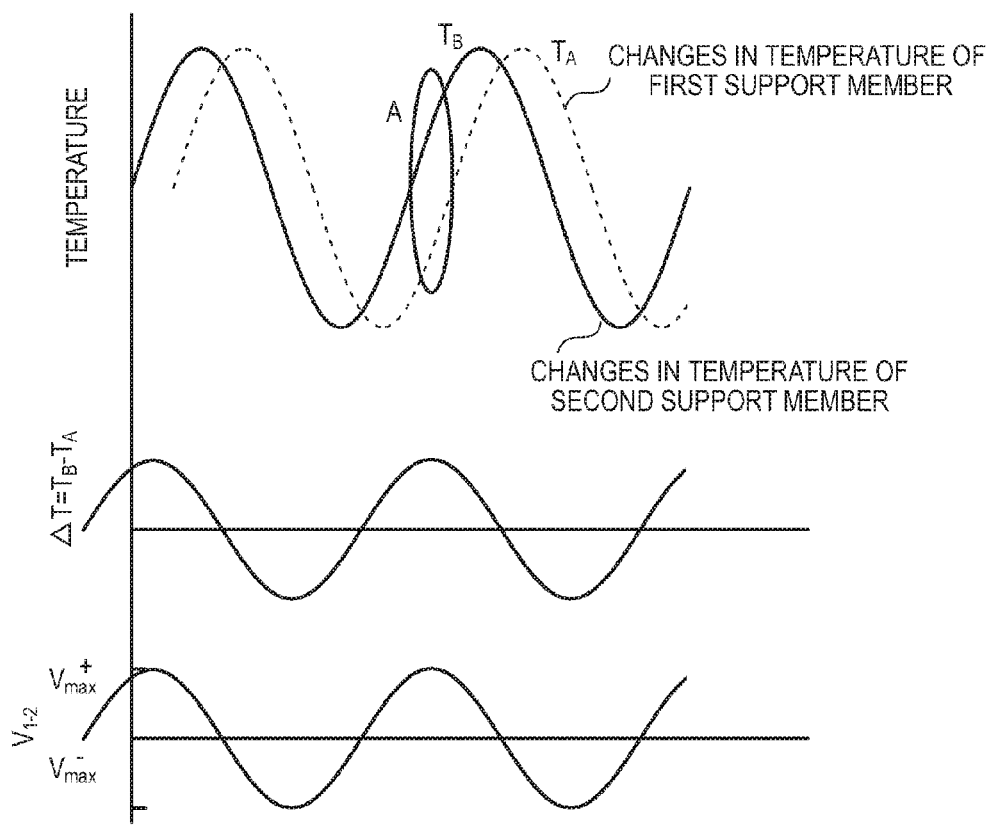
FIG. 1B is a diagram schematically representing the temperature ($T_A$) of a first support member and the temperature ($T_B$) of a second support member, changes in temperature difference between these temperatures ($\Delta T = T_B - T_A$), and changes in voltage $V_{1-2}$ between a first output section and a second output section.

Example 1 concerns the thermoelectric generator according to First Embodiment, and the thermoelectric generation method according to First Embodiment. FIG. 1A is a schematic partial cross sectional view of the thermoelectric generator of Example 1. FIG. 1B schematically represents the temperature ($T_A$) of the first support member, and the temperature ($T_B$) of the second support member; changes in temperature difference between these temperatures ($\Delta T = T_B - T_A$); and changes in voltage $V_{1-2}$ between the first output section and the second output section. Note that, even though the drawings representing the respective Examples show four or eight thermoelectric conversion elements or thermoelectric conversion members, the number of thermoelectric conversion elements or thermoelectric conversion members is not limited thereto.

The thermoelectric generator of Example 1 or Example 2 below includes:

(A) a first support member 11;

(B) a second support member 12 disposed opposite the first support member 11;

(C) a thermoelectric conversion element disposed between the first support member 11 and the second support member 12; and (D) a first output section 41 and a second output section 42 connected to the thermoelectric conversion element.

The thermoelectric conversion element of Example 1 or Example 2 below includes:

(C-1) a first thermoelectric conversion member 21A or 21B disposed between the first support member 11 and the second support member 12; and (C-2) a second thermoelectric conversion member 22A or 22B disposed between the first support member 11 and the second support member 12, and that is made of material different from the material of the first thermoelectric conversion member 21A or 21B, and is electrically connected in series to the first thermoelectric conversion member 21A or 21B.

More specifically, in the thermoelectric generator of Example 1 or Example 2 below, the first thermoelectric conversion member 21A or 21B and the second thermoelectric conversion member 22A or 22B are electrically connected in series via a wire 32 provided on the second support member 12, and the second thermoelectric conversion member 22A or 22B and the first thermoelectric conversion member 21A or 21B are electrically connected in series via a wire 31 provided on the first support member 11. The first output section 41 is connected to an end portion of the first thermoelectric conversion member 21A or 21B on the first support member side. The second output section 42 is connected to an end portion of the second thermoelectric conversion member 22A or 22B on the first support member side.

The first support member 11 is formed of $Al_2O_3$, and the second support member 12 is formed of epoxy resin. The first thermoelectric conversion member, or the third thermoelectric conversion member, the first thermoelectric conversion member A, the second thermoelectric conversion member A, the third thermoelectric conversion member A, and the fourth thermoelectric conversion member A below are formed of bismuth.tellurium.antimony of p-type conductivity. The second thermoelectric conversion member, or the fourth thermoelectric conversion member, the first thermoelectric conversion member B, the second thermoelectric conversion member B, the third thermoelectric conversion member B, and the fourth thermoelectric conversion member B are formed of bismuth.tellurium of n-type conductivity. The first output section 41, the second output section 42, and the wires 31 and 32 have a multilayer structure of a titanium layer, a gold layer, and a nickel layer, from the support member side. The bonding between the thermoelectric conversion member and the wire may be made using a known bonding technique. The Seebeck coefficient of the first thermoelectric conversion member or first thermoelectric conversion element is $SB_1$, the Seebeck coefficient of the second thermoelectric conversion member or second thermoelectric conversion element is $SB_2$, the Seebeck coefficient of the third thermoelectric conversion member or third thermoelectric conversion element is $SB_3$, and the Seebeck coefficient of the fourth thermoelectric conversion member or fourth thermoelectric conversion element is $SB_4$. The same applies to Examples 2 to 10 below.

In the thermoelectric generator of Example 1, the area of first surface $21A_1$ of the first thermoelectric conversion member 21A in contact with the first support member 11 is $S_{11}$, the area of second surface $21A_2$ of the first thermoelectric conversion member 21A in contact with the second support member 12 is $S_{12}$ ($S_{11} > S_{12}$), the area of first surface $22A_1$ of the second thermoelectric conversion member 22A in contact with the first support member 11 is $S_{21}$, and the area of second surface $22A_2$ of the second thermoelectric conversion member 22A in contact with the second support member 12 is $S_{22}$ ($S_{21} > S_{22}$). The first support member 11 and the second support member 12 have thermal response time constants $\tau_{SM1}$ and $\tau_{SM2}$, respectively, which are related to each other by $\tau_{SM1} > \tau_{SM2}$. In Example 1, $S_{12} \neq S_{22}$. The first thermoelectric conversion member 21A and the second thermoelectric conversion member 22A have the shape of a truncated cone, more specifically, a truncated quadrangular pyramid.

In the thermoelectric generation method of Example 1 or Example 2 below, the thermoelectric generator is placed in a temperature-changing atmosphere. When the temperature of the second support member 12 is higher than the temperature of the first support member 11, the current that is generated by the temperature difference between the first support member 11 and the second support member 12, and that flows from the second thermoelectric conversion member 22A or 22B to the first thermoelectric conversion member 21A or 21B is drawn to outside using the first output section 41 as the positive terminal (plus terminal), and the second output section 42 as the negative terminal (minus terminal). In this case, because alternate current flows between the first output section 41 and the second output section 42, the current may be converted to direct current using a known half-wave rectifier circuit, followed by smoothing. When the temperature of the first support member 11 is higher than the temperature of the second support member 12, the current that is generated by the temperature difference between the first support member 11 and the second support member 12, and that flows from the first thermoelectric conversion member 21A or 21B to the second thermoelectric conversion member 22A or 22B can be drawn to outside using the second output section 42 as the positive terminal, and the first output section 41 as the negative terminal. In this case, the alternate current may be converted to direct current using a known full-wave rectifier circuit, followed by smoothing.

Because $\tau_{SM1} > \tau_{SM2}$, the temperature $T_B$ of the second support member 12 of the thermoelectric generator placed in a temperature-changing atmosphere (atmospheric temperature $T_{amb}$ at time indicated by ellipsoid A in FIG. 1B) quickly becomes the atmospheric temperature $T_{amb}$, or a temperature near $T_{amb}$. On the other hand, because $\tau_{SM1} > \tau_{SM2}$, the temperature $T_A$ of the first support member 11 varies by lagging behind the temperature change of the second support member 12. As a result, a temperature difference $\Delta T$ ($=T_B-T_A$) occurs between the temperature $T_A$ ($<T_{amb}$) of the first support member 11 and the temperature $T_B$ ($=T_{amb}$) of the second support member 12. As a rule, the relation $T_{12}=T_{22}>T_{11}=T_{21}$ is established, where $T_{11}$ is the temperature in the vicinity of the first surface $21A_1$ of the first thermoelectric conversion member 21A in contact with the first support member 11, $T_{12}$ is the temperature in the vicinity of the second surface $21A_2$ of the first thermoelectric conversion member 21A in contact with the second support member 12, $T_{21}$ is the temperature in the vicinity of the first surface $22A_1$ of the second thermoelectric conversion member 22A in contact with the first support member 11, and $T_{22}$ is the temperature in the vicinity of the second surface $22A_2$ of the second thermoelectric conversion member 22A in contact with the second support member 12. The electromotive force EMF by a single thermoelectric conversion element can be determined by $$EMF = T_{12} \times SB_1 - T_{21} \times SB_2.$$

Figure 18:
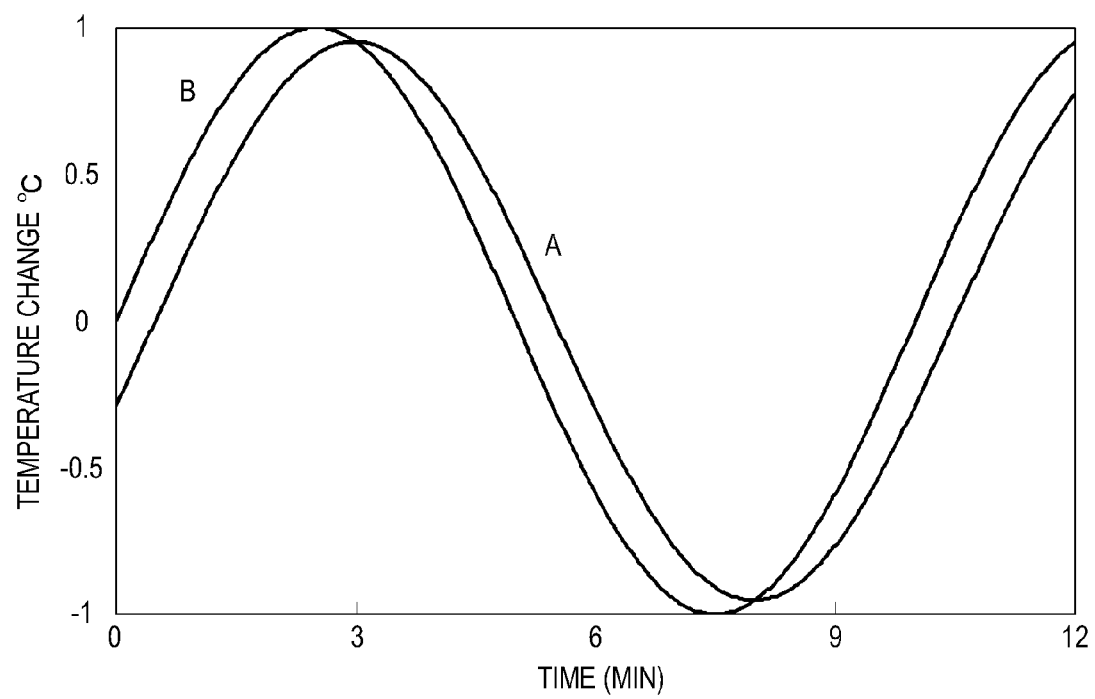
FIG. 18 is a graph representing the simulation result of changes in the temperature difference $\Delta T$ ($= T_B - T_A$) between the temperature $T_B$ of a second support member and the temperature $T_A$ of a first support member in response to assumed sinusoidal temperature changes in the atmosphere.

It is assumed here that the temperature change in the atmosphere is sinusoidal, and that the difference $\Delta T_{amb}$ between the maximum temperature and the minimum temperature of the temperature change is 2° C. The temperature change cycle (TM=$2\pi/\omega$) is assumed to be 10 minutes. FIG. 18 represents the simulation result of changes in the temperature difference $\Delta T$ ($=T_B-T_A$) between the temperature $T_B$ of the second support member 12 and the temperature $T_A$ of the first support member 11 in response to such temperature changes. In FIG. 18, the curve B represents changes in temperature $T_B$ of the second support member 12, and the curve A represents changes in temperature $T_A$ of the first support member 11.

EXAMPLE 2

Figure 2A:
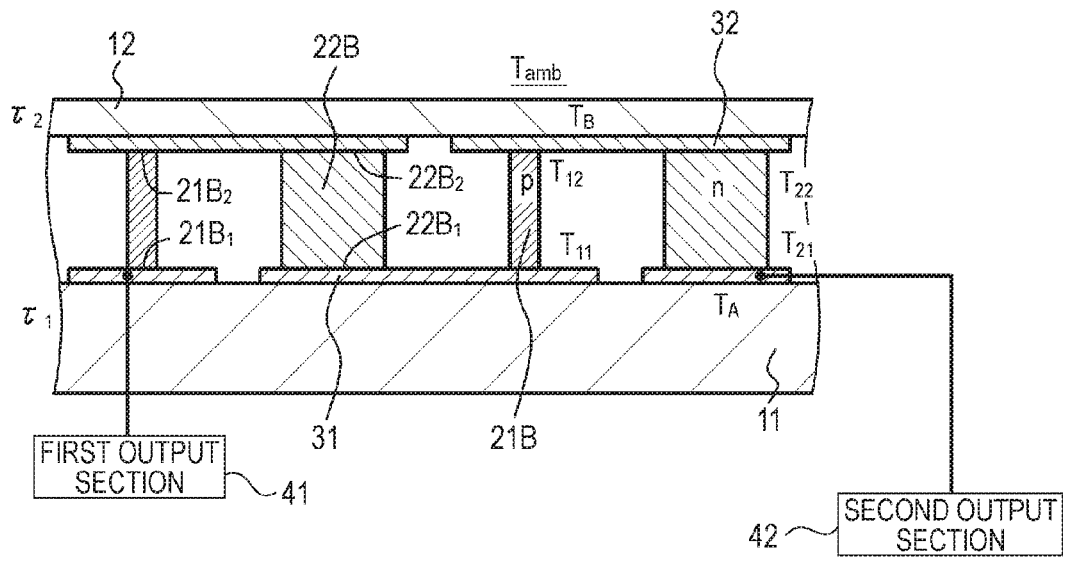
FIG. 2A is a schematic partial cross sectional view of a thermoelectric generator of Example 2.
Figure 2B:
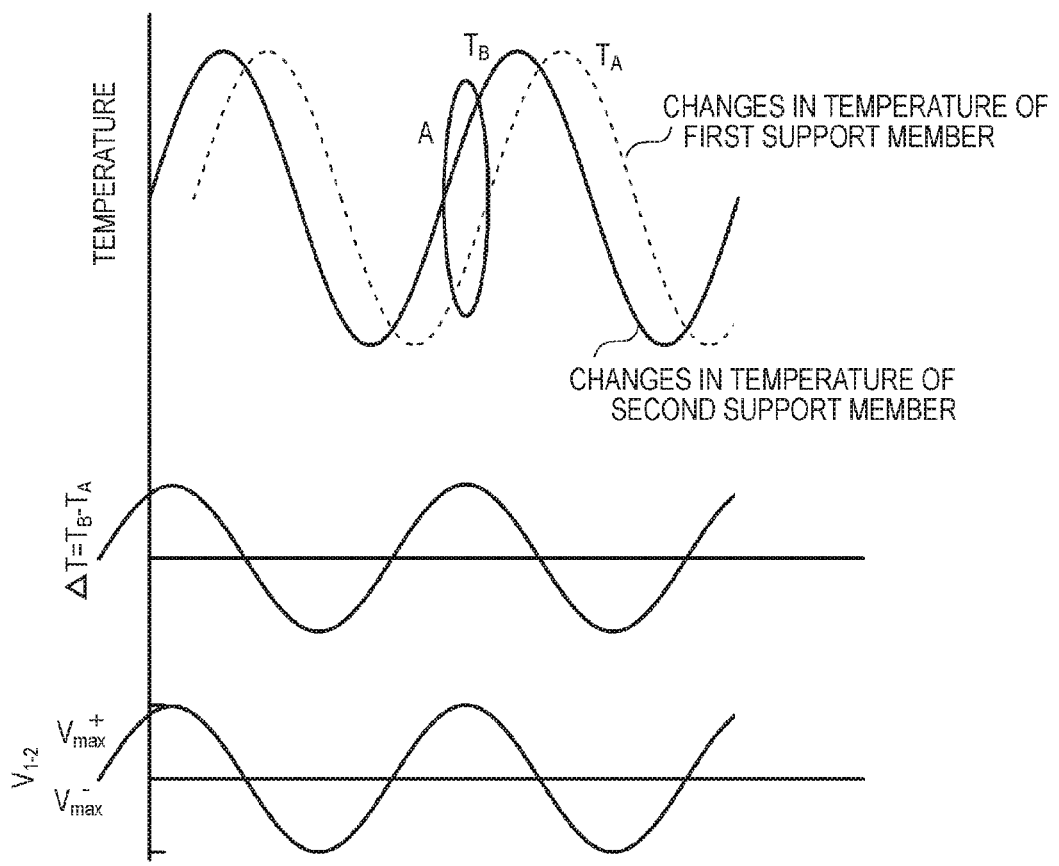
FIG. 2B is a diagram representing the temperature ($T_A$) of a first support member and the temperature ($T_B$) of a second support member, changes in temperature difference between these temperatures ($\Delta T = T_B - T_A$), and changes in voltage $V_{1-2}$ between a first output section and a second output section.

Example 2 concerns the thermoelectric generator according to Second Embodiment, and the thermoelectric generation method according to Second Embodiment. FIG. 2A is a schematic partial cross sectional view of the thermoelectric generator of Example 2. FIG. 2B schematically represents the temperature ($T_A$) of the first support member, and the temperature ($T_B$) of the second support member; changes in temperature difference between these temperatures ($\Delta T = T_B - T_A$); and changes in voltage $V_{1-2}$ between the first output section and the second output section.

Example 2 differs from Example 1 in that the first thermoelectric conversion member 21B and the second thermoelectric conversion member 22B are columnar in shape, specifically, quadrangular columns. Further, in this Example, the relations $\tau_{SM1} > \tau_{SM2}$, and $VL_1 \ne VL_2$ (specifically, $VL_1 < VL_2$ in Example 2) are established, where $VL_1$ is the volume of the first thermoelectric conversion member 21B, $VL_2$ is the volume of the second thermoelectric conversion member 22B, $\tau_{SM1}$ is the thermal response time constant of the first support member 11, and $\tau_{SM2}$ is the thermal response time constant of the second support member 12.

Because $\tau_{SM1} > \tau_{SM2}$, as in Example 1, the temperature $T_B$ of the second support member 12 of the thermoelectric generator placed in a temperature-changing atmosphere (atmospheric temperature $T_{amb}$ at time indicated by ellipsoid A in FIG. 2B) quickly becomes the atmospheric temperature $T_{amb}$, or a temperature near $T_{amb}$. On the other hand, because $\tau_{SM1} > \tau_{SM2}$, the temperature $T_A$ of the first support member 11 varies by lagging behind the temperature change of the second support member 12. As a result, a temperature difference $\Delta T$ ($=T_B-T_A$) occurs between the temperature $T_A$ ($<T_{amb}$) of the first support member 11 and the temperature $T_B$ ($=T_{amb}$) of the second support member 12. Provided that $VL_1 < VL_2$, the relations $T_{12} > T_{22} > T_{11} > T_{21}$, and $T_{12} - T_{11} > T_{22} - T_{21}$ are established, where $T_{11}$ is the temperature in the vicinity of the first surface $21B_1$ of the first thermoelectric conversion member 21B in contact with the first support member 11, $T_{12}$ is the temperature in the vicinity of the second surface $21B_2$ of the first thermoelectric conversion member 21B in contact with the second support member 12, $T_{21}$ is the temperature in the vicinity of the first surface $22B_1$ of the second thermoelectric conversion member 22B in contact with the first support member 11, and $T_{22}$ is the temperature in the vicinity of the second surface $22B_2$ of the second thermoelectric conversion member 22B in contact with the second support member 12. The electromotive force EMF by a single thermoelectric conversion element can be determined by $EMF = (T_{12}-T_{11}) \times SB_1 + (T_{21}-T_{22}) \times SB_2$.

EXAMPLE 3

Figure 3A:
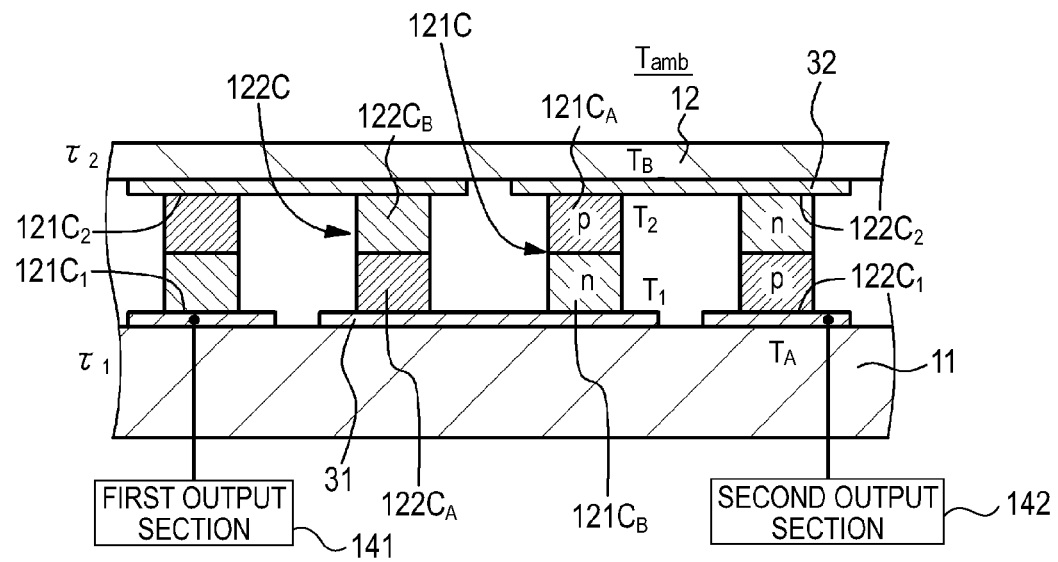
FIG. 3A is a schematic partial cross sectional view of a thermoelectric generator of Example 3.
Figure 3B:
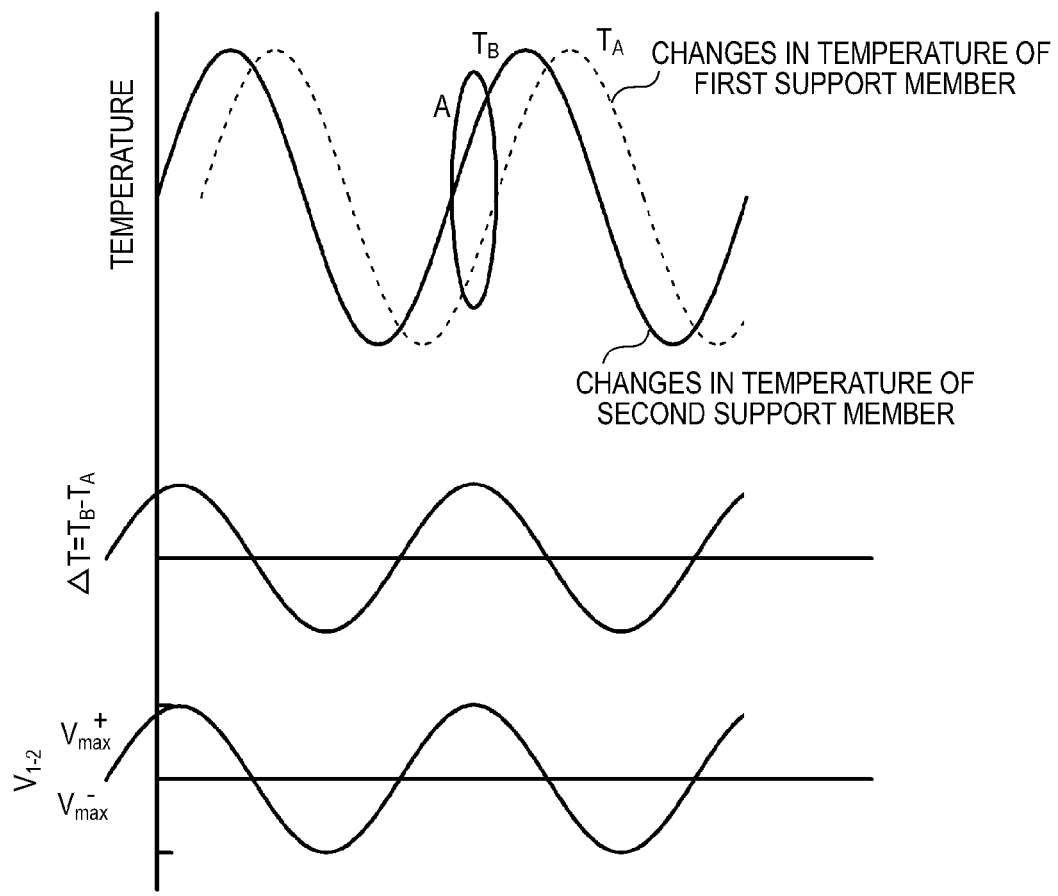
FIG. 3B is a diagram representing the temperature ($T_A$) of a first support member and the temperature ($T_B$) of a second support member, changes in temperature difference between these temperatures ($\Delta T = T_B - T_A$), and changes in voltage $V_{1-2}$ between a first output section and a second output section.

Example 3 concerns the thermoelectric generator of Third Embodiment, and the thermoelectric generation method according to Third Embodiment. FIG. 3A is a schematic partial cross sectional view of the thermoelectric generator of Example 3. FIG. 3B schematically represents the temperature ($T_A$) of the first support member, the temperature ($T_B$) of the second support member; changes in temperature difference between these temperatures ($\Delta T = T_B - T_A$); and changes in voltage $V_{1-2}$ between the first output section and the second output section.

The thermoelectric generator of Example 3 includes:

(A) a first support member 11;

(B) a second support member 12 disposed opposite the first support member 11;

(C) a first thermoelectric conversion element 121C disposed between the first support member 11 and the second support member 12;

(D) a second thermoelectric conversion element 122C disposed between the first support member 11 and the second support member 12; and (E) a first output section 141 and a second output section 142.

In the thermoelectric generator of Example 3, the first thermoelectric conversion element 121C includes a first thermoelectric conversion member A-121C$_A$ in contact with the second support member 12, and a first thermoelectric conversion member B-121C$_B$ in contact with the first support member 11. The first thermoelectric conversion member A-121C$_A$ and the first thermoelectric conversion member B-121C$_B$ are in contact with (specifically, laminated with) each other. The second thermoelectric conversion element 122C includes a second thermoelectric conversion member A-122C$_A$ in contact with the first support member 11, and a second thermoelectric conversion member B-122C$_B$ in contact with the second support member 12. The second thermoelectric conversion member A-122C$_A$ and the second thermoelectric conversion member B-122C$_B$ are in contact with (specifically, laminated with) each other.

The first thermoelectric conversion element 121C and the second thermoelectric conversion element 122C are electrically connected to each other in series. The first output section 141 is connected to an end portion of the first thermoelectric conversion member B-121C$_B$. The second output section 142 is connected to an end portion of the second thermoelectric conversion member A-122C$_A$. The first thermoelectric conversion member A-121C$_A$ and the second thermoelectric conversion member B-122C$_B$ are electrically connected to each other via a wire 32 provided on the second support member 12. The second thermoelectric conversion member A-122C$_A$ and the first thermoelectric conversion member B-121C$_B$ are electrically connected to each other via a wire 31 provided on the first support member 11.

The relation $\tau_{SM1} \neq \tau_{SM2}$ is established, where $\tau_{SM1}$ is the thermal response time constant of the first support member 11, and $\tau_{SM2}$ is the thermal response time constant of the second support member 12. The first thermoelectric conversion element 121C and the second thermoelectric conversion element 122C are columnar in shape, specifically, quadrangular columns.

In the thermoelectric generation method of Example 3, the thermoelectric generator is placed in a temperature-changing atmosphere. When the temperature of the second support member 12 is higher than the temperature of the first support member 11, the current that is generated due to the temperature difference between the first support member 11 and the second support member 12, and that flows from the second thermoelectric conversion element 122C to the first thermoelectric conversion element 121C is drawn to outside using the first output section 141 as the positive terminal, and the second output section 142 as the negative terminal. In this case, because alternate current flows between the first output section 141 and the second output section 142, the current may be converted into direct current using a known half-wave rectifier circuit, followed by smoothing. When the temperature of the first support member 11 is higher than the temperature of the second support member 12, the current that is generated due to the temperature difference between the first support member 11 and the second support member 12, and that flows from the first thermoelectric conversion element 121C to the second thermoelectric conversion element 122C can be drawn to outside using the second output section 142 as the positive terminal, and the first output section 141 as the negative terminal. In this case, the alternate current may be converted into direct current using a known full-wave rectifier circuit, followed by smoothing.

When $\tau_{SM1} > \tau_{SM2}$, the temperature $T_B$ of the second support member 12 of the thermoelectric generator placed in a temperature-changing atmosphere (atmospheric temperature $T_{amb}$ at time indicated by ellipsoid A in FIG. 3B) quickly becomes the atmospheric temperature $T_{amb}$, or a temperature near $T_{amb}$. On the other hand, because $\tau_{SM1} > \tau_{SM2}$, the temperature $T_A$ of the first support member 11 varies by lagging behind the temperature change of the second support member 12. As a result, a temperature difference $\Delta T$ ($=T_B-T_A$) occurs between the temperature $T_A$ ($<T_{amb}$) of the first support member 11 and the temperature $T_B$ ($=T_{amb}$) of the second support member 12. The relation $T_2>T_1$ is established, where $T_2$ is the temperature in the vicinity of the second surface 121C$_2$ of the first thermoelectric conversion element 121C in contact with the second support member 12, and the temperature in the vicinity of the second surface 122C$_2$ of the second thermoelectric conversion element 122C in contact with the second support member 12, and $T_1$ is the temperature in the vicinity of the first surface 121C$_1$ of the first thermoelectric conversion element 121C in contact with the first support member 11, and the temperature in the vicinity of the first surface 122C$_1$ of the second thermoelectric conversion element 122C in contact with the first support member 11. The electromotive force EMF by a single pair of the thermoelectric conversion elements 121C and 122C can be determined by $EMF=T_2 \times SB_1 - T_1 \times SB_2$.

EXAMPLE 4

Figure 4:
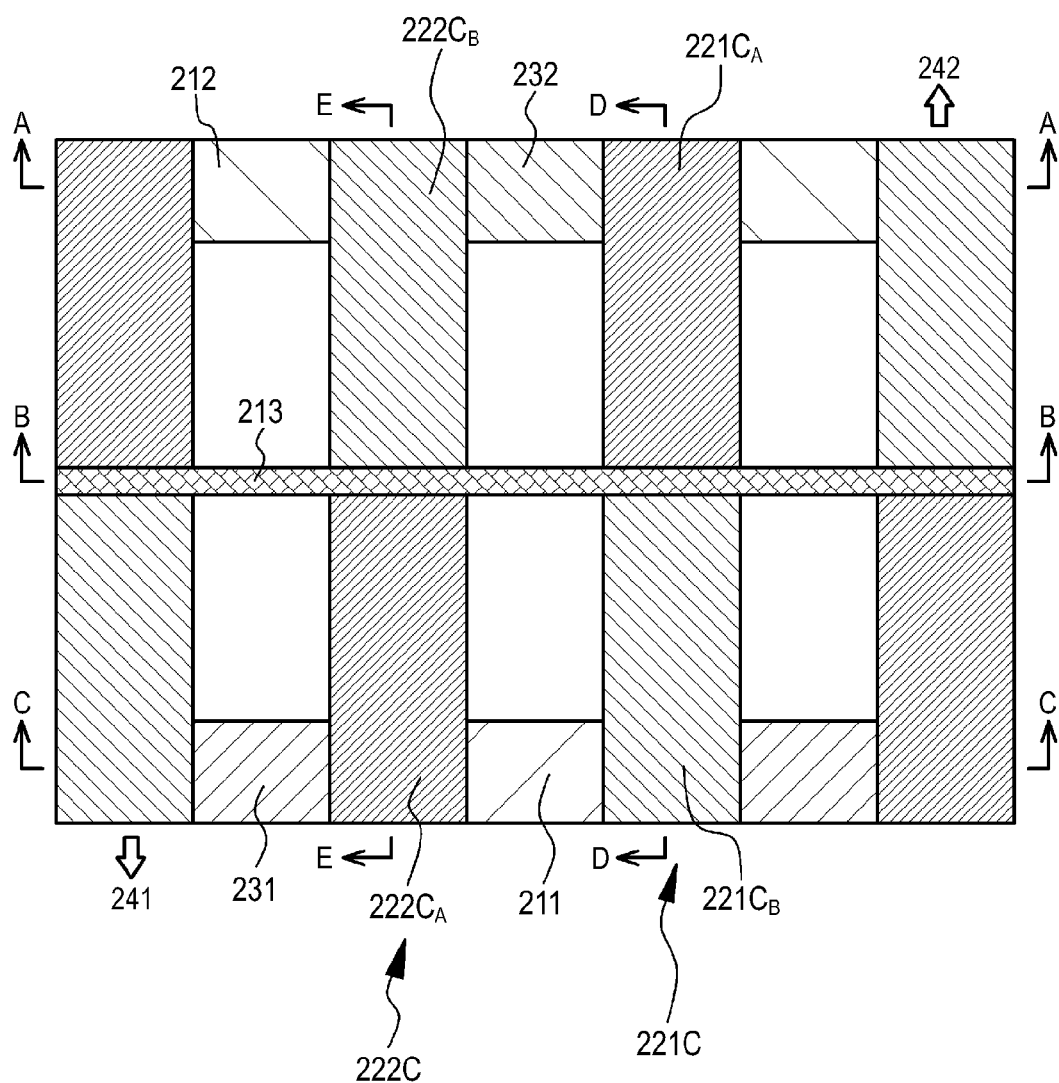
FIG. 4 is a schematic partial plan view of a thermoelectric generator of Example 4.

Example 4 is a variation of Example 3. In Example 3, the first thermoelectric conversion element 121C and the second thermoelectric conversion element 122C are laminated elements, specifically, the laminate of the first thermoelectric conversion member A-121C$_A$ and the first thermoelectric conversion member B-121C$_B$, and the laminate of the second thermoelectric conversion member A-122C$_A$ and the second thermoelectric conversion member B-122C$_B$. In Example 4, a first thermoelectric conversion element 221C and a second thermoelectric conversion element 222C are provided that are horizontally disposed elements. FIG. 4 is a schematic partial plan view of the thermoelectric generator of Example 4. FIGS. 5A, 5B, 5C, 5D, and 5E are schematic partial cross sectional views of the thermoelectric generator of Example 4 illustrated in FIG. 4, at arrows A-A, B-B, C-C, D-D, and E-E, respectively. In FIG. 4, the constituting elements of the thermoelectric generator are hatched for clarity.

In Example 4, the first thermoelectric conversion element 221C includes a first thermoelectric conversion member A-221C$_A$ in contact with the second support member 212, and a first thermoelectric conversion member B-221C$_B$ in contact with the first support member 211. The first thermoelectric conversion member A-221C$_A$ and the first thermoelectric conversion member B-221C$_B$ are disposed in contact with each other along the horizontal direction. The second thermoelectric conversion element 222C includes a second thermoelectric conversion member A-222C$_A$ in contact with the first support member 211, and a second thermoelectric conversion member B-222C$_B$ in contact with the second support member 212. The second thermoelectric conversion member A-222$C_A$ and the second thermoelectric conversion member B-222$C_B$ are disposed in contact with each other along the horizontal direction. More specifically, the first thermoelectric conversion member A-221$C_A$ and the first thermoelectric conversion member B-221$C_B$ are in contact with each other via a joint member 213 on their end faces along the horizontal direction. Similarly, the second thermoelectric conversion member A-222$C_A$ and the second thermoelectric conversion member B-222$C_B$ are in contact with each other via the joint member 213 on their end faces along the horizontal direction. The second support member 212 is disposed beneath the end portions of the first thermoelectric conversion member A-221$C_A$ and the second thermoelectric conversion member B-222$C_B$, supporting the first thermoelectric converting member A-221$C_A$ and the second thermoelectric conversion member B-222$C_B$. Similarly, the first support member 211 is disposed beneath the end portions of the first thermoelectric conversion member B-221$C_B$ and the second thermoelectric conversion member A-222$C_A$, supporting the first thermoelectric conversion member B-221$C_B$ and the second thermoelectric conversion member A-222$C_A$.

The first thermoelectric conversion element 221C and the second thermoelectric conversion element 222C are electrically connected to each other in series. The first output section 241 is connected to an end portion of the first thermoelectric conversion member B-221$C_B$. The second output section 242 is connected to an end portion of the second thermoelectric conversion member A-222$C_A$. The first thermoelectric conversion member A-221$C_A$ and the second thermoelectric conversion member B-222$C_B$ are electrically connected to each other via a wire 232 provided on the second support member 212. The second thermoelectric conversion member A-222$C_A$ and the first thermoelectric conversion member B-221$C_B$ are electrically connected to each other via a wire 231 provided on the first support member 12.

As in Example 3, the relation $\tau_{SM1} \neq \tau_{SM2}$ is established, where $\tau_{SM1}$ is the thermal response time constant of the first support member 211, and $\tau_{SM2}$ is the thermal response time constant of the second support member 212. The first thermoelectric conversion element 221C and the second thermoelectric conversion element 222C are cuboid (tabular) in shape.

In the thermoelectric generation method of Example 4, the thermoelectric generator is placed in a temperature-changing atmosphere. When the temperature of the second support member 212 is higher than the temperature of the first support member 211, the current that is generated due to the temperature difference between the first support member 211 and the second support member 212, and that flows from the second thermoelectric conversion element 222C to the first thermoelectric conversion element 221C is drawn to outside using the first output section 241 as the positive terminal, and the second output section 242 as the negative terminal. In this case, because alternate current flows between the first output section 241 and the second output section 242, the current may be converted into direct current using a known half-wave rectifier circuit, followed by smoothing. When the temperature of the first support member 211 is higher than the temperature of the second support member 212, the current that is generated by the temperature difference between the first support member 211 and the second support member 212, and that flows from the first thermoelectric conversion element 221C to the second thermoelectric conversion element 222C can be drawn to outside using the second output section 242 as the positive terminal, and the first output section 241 as the negative terminal. In this case, the alternate current may be converted to direct current using a known full-wave rectifier circuit, followed by smoothing.

When $\tau_{SM1} > \tau_{SM2}$, the temperature $T_B$ of the second support member 212 of the thermoelectric generator placed in a temperature-changing atmosphere (atmospheric temperature $T_{amb}$ at time indicated by ellipsoid A in FIG. 3B) quickly becomes the atmospheric temperature $T_{amb}$, or a temperature near $T_{amb}$. On the other hand, because $\tau_{SM1} > \tau_{SM2}$, the temperature $T_A$ of the first support member 211 varies by lagging behind the temperature change of the second support member 212. As a result, a temperature difference $\Delta T$ $(=T_B-T_A)$ occurs between the temperature $T_A$ ($<T_{amb}$) of the first support member 211 and the temperature $T_B$ ($=T_{amb}$) of the second support member 212. Thus, the relation $T_2 > T_1$ is established, where $T_2$ is the temperature in the vicinity of the first thermoelectric conversion member A-221$C_A$ and the second thermoelectric conversion member B-222$C_B$ in contact with the second support member 212, and $T_1$ is the temperature in the vicinity of the first thermoelectric conversion member B-221$C_B$ and the second thermoelectric conversion member A-222$C_A$ in contact with the first support member 211. The electromotive force EMF by a single pair of the thermoelectric conversion elements 221C and 222C can be determined by EMF=$T_2 \times SB_1 - T_1 \times SB_2$.

In some cases, the relations $\tau_{SM3} \neq \tau_{SM1}$, $\tau_{SM3} \neq \tau_{SM2}$, and $\tau_{SM1} = \tau_{SM2}$ may be established, where $\tau_{SM3}$ is the thermal response time constant of the joint member 213.

EXAMPLE 5

Example 5 concerns the thermoelectric generation method according to Fourth Embodiment A.

Figure 6A:
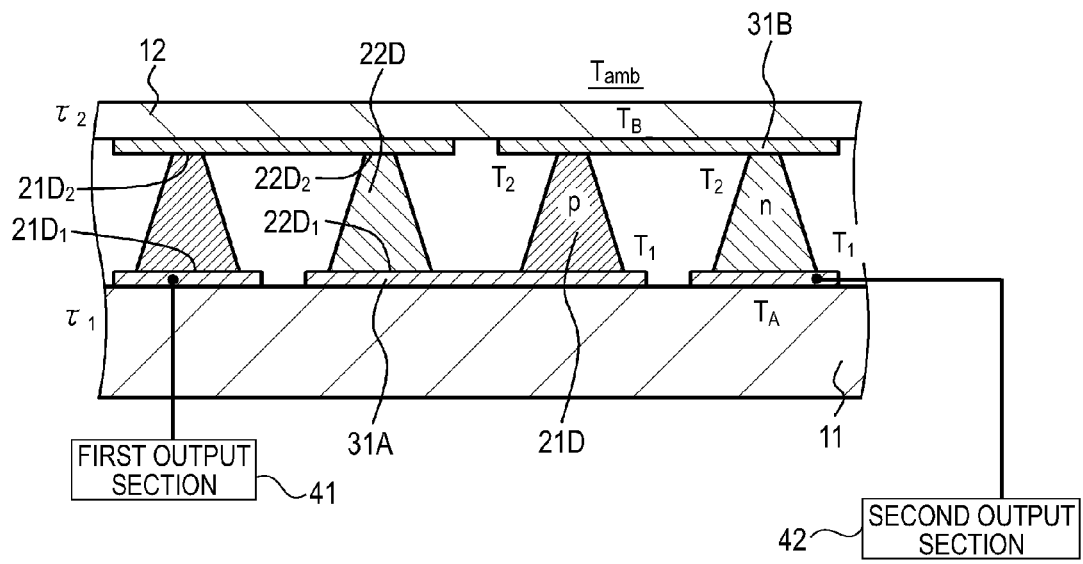
FIGS. 6A and 6B are schematic partial cross sectional views of a thermoelectric generator of Example 5.
Figure 6B:
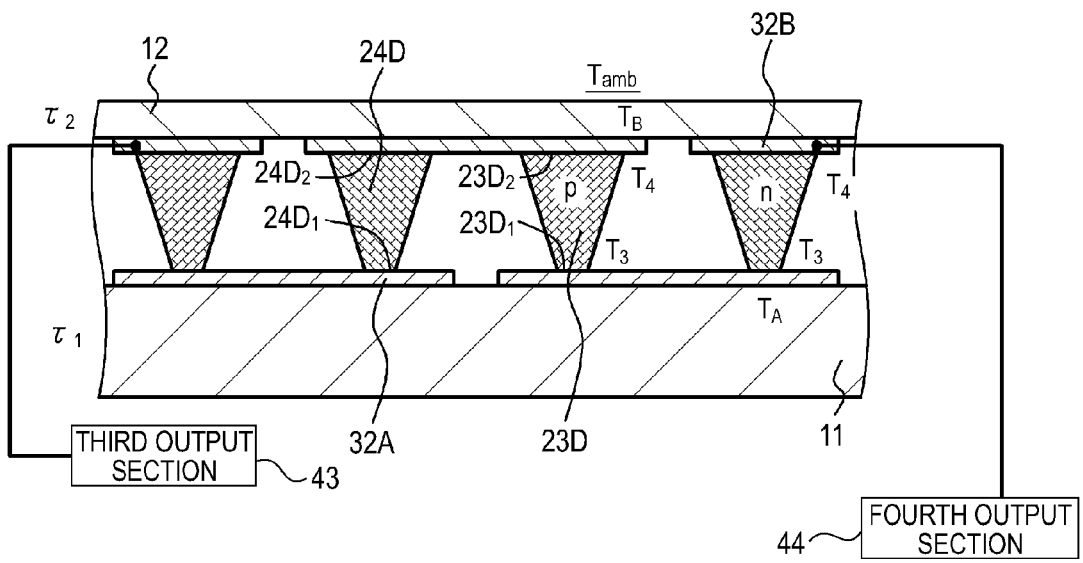
Figure 7:
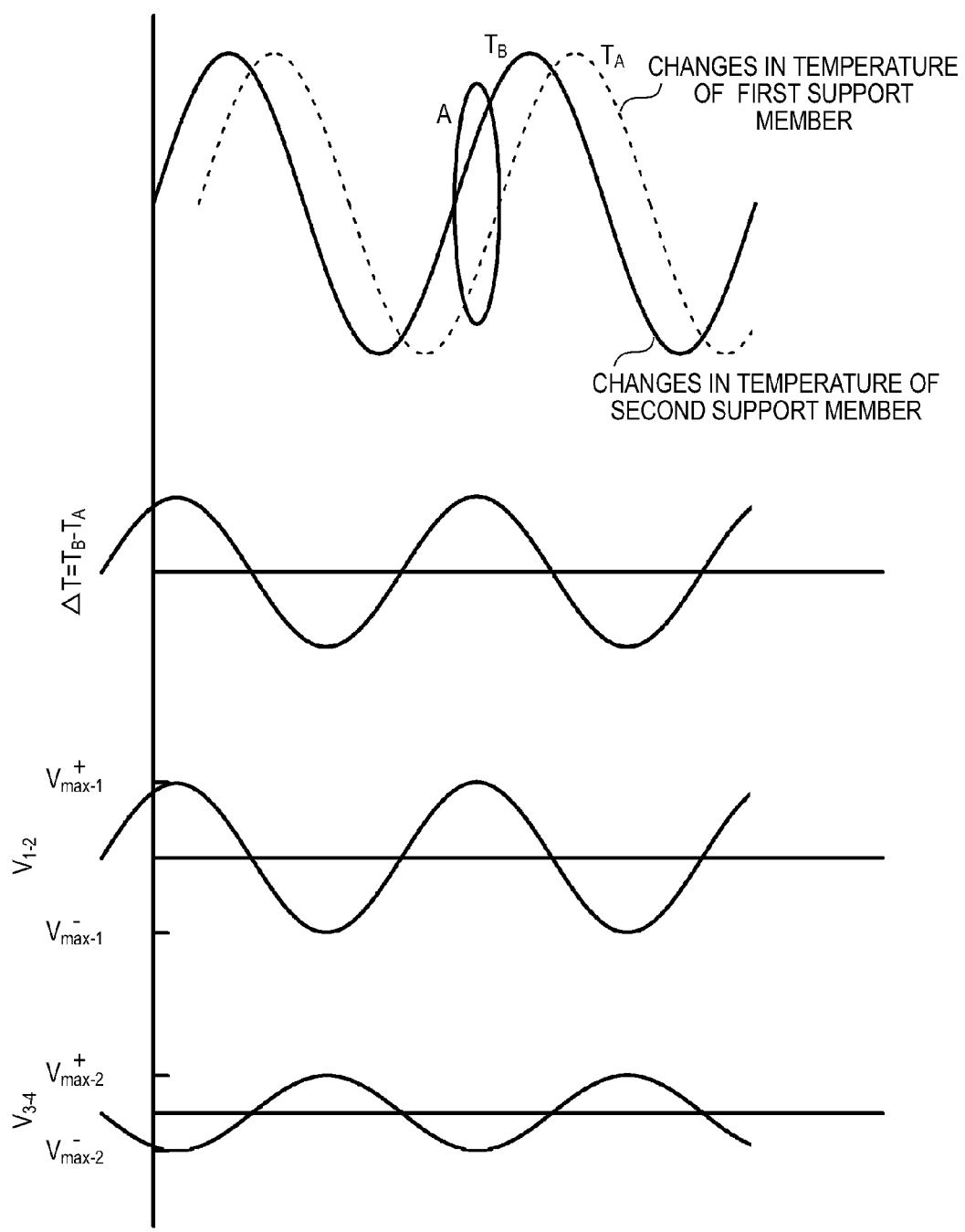
FIG. 7 is a diagram schematizing the temperature ($T_A$) of a first support member and the temperature ($T_B$) of a second support member of Example 5, changes in temperature difference between these temperatures ($\Delta T = T_B - T_A$), changes in voltage $V_{1-2}$ between a first output section and a second output section, and changes in $V_{3-4}$ between a third output section and a fourth output section.

FIGS. 6A and 6B are schematic partial cross sectional views of a thermoelectric generator suitable for use in the thermoelectric generation method of Example 5. FIG. 7 schematically represents the temperature ($T_A$) of the first support member and the temperature ($T_B$) of the second support member; changes in temperature difference between these temperatures ($\Delta T = T_B - T_A$); changes in voltage $V_{1-2}$ between the first output section and the second output section; and changes in voltage $V_{3-4}$ between the third output section and the fourth output section.

The thermoelectric generator of Example 5 or of Examples 6 and 7 below includes:

(A) a first support member 11;
(B) a second support member 12 disposed opposite the first support member 11;
(C) a first thermoelectric conversion element disposed between the first support member 11 and the second support member 12;
(D) a second thermoelectric conversion element disposed between the first support member 11 and the second support member 12; and
(E) a first output section 41, a second output section 42, a third output section 43, and a fourth output section 44.

The first thermoelectric conversion element includes:

(C-1) a first thermoelectric conversion member 21D, 21E, or 21F disposed between the first support member 11 and the second support member 12;
(C-2) a second thermoelectric conversion member 22D, 22E, or 22F disposed between the first support member 11 and the second support member 12, and that is made of material different from the material of the first thermoelectric conversion member 21D, 21E, or 21F, and is electrically connected to the first thermoelectric conversion member 21D, 21E, or 21F in series.

The second thermoelectric conversion element includes:

(D-1) a third thermoelectric conversion member 23D, 23E, or 23F disposed between the first support member 11 and the second support member 12; and (D-2) a fourth thermoelectric conversion member 24D, 24E, or 24F disposed between the first support member 11 and the second support member 12, and that is made of material different from that of the third thermoelectric conversion member 23D, 23E, or 23F, and is electrically connected to the third thermoelectric conversion member 23D, 23E, or 23F in series.

The first output section 41 is connected to the first thermoelectric conversion member 21D, 21E, or 21F. The second output section 42 is connected to the second thermoelectric conversion member 22D, 22E, or 22F. The third output section 43 is connected to the third thermoelectric conversion member 23D, 23E, or 23F. The fourth output section 44 is connected to the fourth thermoelectric conversion member 24D, 24E, or 24F.

More specifically, in Example 5 or Examples 6 and 7 below, the first thermoelectric conversion member 21D, 21E, or 21F and the second thermoelectric conversion member 22D, 22E, or 22F are electrically connected to each other in series via a wire 31B provided on the second support member 12. The second thermoelectric conversion member 22D, 22E, or 22F and the first thermoelectric conversion member 21D, 21E, or 21F are electrically connected to each other in series via a wire 31A provided on the first support member 11. The third thermoelectric conversion member 23D, 23E, or 23F and the fourth thermoelectric conversion member 24D, 24E, or 24F are electrically connected to each other in series via a wire 32A provided on the first support member 11. The fourth thermoelectric conversion member 24D, 24E, or 24F and the third thermoelectric conversion member 23D, 23E, or 23F are electrically connected to each other in series via a wire 32B provided on the second support member 12.

The first thermoelectric conversion member 21D has a first surface $21D_1$ of area $S_{11}$ and a second surface $21D_2$ of area $S_{12}$ ($S_{11} > S_{12}$). The second thermoelectric conversion member 22D has a first surface $22D_1$ of area $S_{21}$, and a second surface $22D_2$ of area $S_{22}$ ($S_{21} > S_{22}$). The third thermoelectric conversion member 23D has a first surface $23D_1$ of area $S_{31}$, and a second surface $23D_2$ of area $S_{32}$ ($S_{31} < S_{32}$). The fourth thermoelectric conversion member 24D has a first surface $24D_1$ of area $S_{41}$, and a second surface $24D_2$ of area $S_{42}$ ($S_{41} < S_{42}$). The first surfaces $21D_1$ and $22D_1$ of the first thermoelectric conversion member 21D and the second thermoelectric conversion member 22D are in contact with the first support member 11. The second surfaces $21D_2$ and $22D_2$ of the first thermoelectric conversion member 21D and the second thermoelectric conversion member 22D are in contact with the second support member 12. The first surfaces $23D_1$ and $24D_1$ of the third thermoelectric conversion member 23D and the fourth thermoelectric conversion member 24D are in contact with the first support member 11. The second surfaces $23D_2$ and $24D_2$ of the third thermoelectric conversion member 23D and the fourth thermoelectric conversion member 24D are in contact with the second support member 12. The first thermoelectric conversion member 21D, the second thermoelectric conversion member 22D, the third thermoelectric conversion member 23D, and the fourth thermoelectric conversion member 24D have the shape of truncated cones, specifically, truncated quadrangular pyramids. Note that the first to fourth thermoelectric conversion members of the thermoelectric generator of Example 6 below have the same configurations as the first to fourth thermoelectric conversion members of the thermoelectric generator of Example 5 described above.

The relation $\tau_{SM1} \neq \tau_{SM2}$ is established, where $\tau_{SM1}$ is the thermal response time constant of the first support member 11, and $\tau_{SM2}$ is the thermal response time constant of the second support member 12. Further, the relation $\tau_{TE1} \neq \tau_{TE2}$ is established, where $\tau_{TE1}$ is the thermal response time constant of the first thermoelectric conversion element, and $\tau_{TE2}$ is the thermal response time constant of the second thermoelectric conversion element.

The first output section 41 is connected to an end portion of the first thermoelectric conversion member 21D on the first support member side. The second output section 42 is connected to an end portion of the second thermoelectric conversion member 22D on the first support member side. The third output section 43 is connected to an end portion of the third thermoelectric conversion member 23D on the second support member side. The fourth output section 44 is connected to an end portion of the fourth thermoelectric conversion member 24D on the second support member side. Specifically, the first output section 41 and the second output section 42, and the third output section 43 and the fourth output section 44 are disposed on different support members.

Figure 17A:
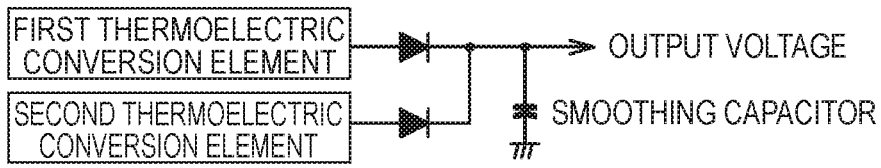
FIGS. 17A to 17C are circuit diagrams representing examples of rectifier circuits.
Figure 17B:
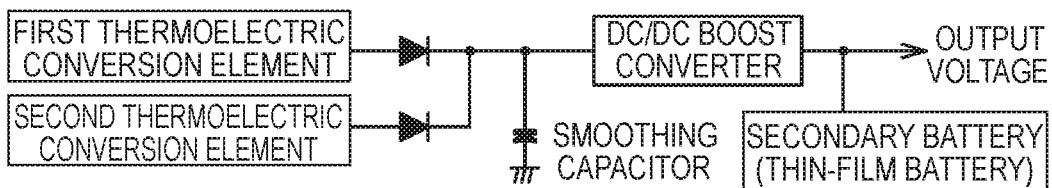

In the thermoelectric generation method of Example 5, the thermoelectric generator is placed in a temperature-changing atmosphere. When the temperature of the second support member 12 is higher than the temperature of the first support member 11, the current that is generated due to the temperature difference between the first support member 11 and the second support member 12, and that flows from the second thermoelectric conversion member 22D to the first thermoelectric conversion member 21D is drawn to outside using the first output section 41 as the positive terminal, and the second output section 42 as the negative terminal. On the other hand, when the temperature of the first support member 11 is higher than the temperature of the second support member 12, the current that is generated by the temperature difference between the first support member 11 and the second support member 12, and that flows from the fourth thermoelectric conversion member 24D to the third thermoelectric conversion member 23D is drawn to outside using the third output section 43 as the positive terminal, and the fourth output section 44 as the negative terminal. In this case, because alternate current flows between the first output section 41 and the second output section 42 and between the third output section 43 and the fourth output section 44, the current may be converted into direct current using a known half-wave rectifier circuit, followed by smoothing. The conversion of alternate current into direct current, and the subsequent smoothing may be performed using the circuit illustrated in FIG. 17A. Alternatively, the conversion of alternate current into direct current, and the subsequent smoothing may be performed using the circuit illustrated in FIG. 17B, and the current may be stored in a secondary battery (for example, a thin-film battery). The rectifier circuit illustrated in FIG. 17A or 17B is also applicable to the other Examples. Note that the phase of the voltage ("phase-1" for convenience) drawn to outside using the first output section 41 and the second output section 42 as the positive and negative terminals, respectively, and the phase of the voltage ("phase-2" for convenience) drawn to outside using the third output section 43 and the fourth output section 44 as the positive and negative terminals, respectively, are out of phase with each other by about 180°. In other words, phase-1 and phase-2 are reversed phases, or substantially reversed phases.

When the temperature of the first support member 11 is higher than the temperature of the second support member 12, the current that is generated due to the temperature difference between the first support member 11 and the second support member 12, and that flows from the first thermoelectric conversion member 21D to the second thermoelectric conversion member 22D can be drawn to outside using the second output section 42 as the positive terminal, and the first output section 41 as the negative terminal. When the temperature of the second support member 12 is higher than the temperature of the first support member 11, the current that flows from the third thermoelectric conversion member 23D to the fourth thermoelectric conversion member 24D can be drawn to outside using the fourth output section 44 as the positive terminal, and the third output section 43 as the negative terminal. In this case, the alternate current may be converted into direct current using a full-wave rectifier circuit, followed by smoothing. The same is applicable to Examples 6 and 7 below.

Figure 17C:
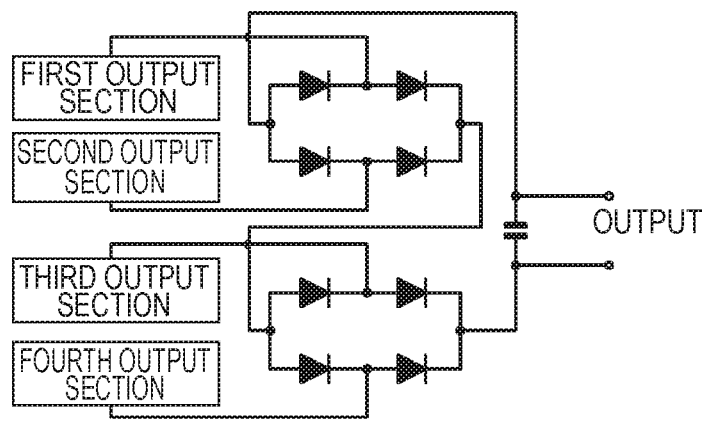
Figure 17D:
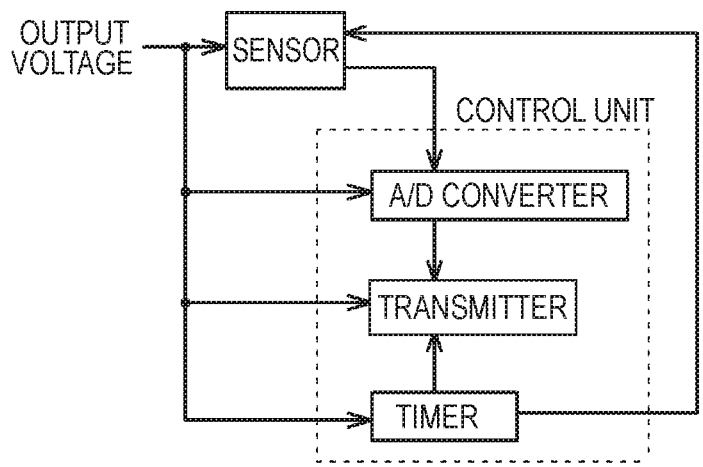
FIG. 17D is a conceptual view representing an application example of a thermoelectric generator of an embodiment.

FIG. 17D is a conceptual view representing an application example of the thermoelectric generator. This application example is a measurement device used to obtain biological information such as body temperature, blood pressure, and pulse. The thermoelectric generator supplies power to the sensor measuring body temperature, blood pressure, pulse, or other information, and to the A/D converter, the transmitter, and the timer forming the control unit. By the operation of the timer, values from the sensor are sent to the A/D converter at predetermined time intervals, and the transmitter sends the data of these values to outside.

When $\tau_{SM1} > \tau_{SM2}$, the temperature $T_B$ of the second support member 12 of the thermoelectric generator placed in a temperature-changing atmosphere (atmospheric temperature $T_{amb}$ at time indicated by ellipsoid A in FIG. 7) quickly becomes the atmospheric temperature $T_{amb}$, or a temperature near $T_{amb}$. On the other hand, because $\tau_{SM1} > \tau_{SM2}$, the temperature $T_A$ of the first support member 11 varies by lagging behind the temperature change of the second support member 12. As a result, a temperature difference $\Delta T$ ($=T_B-T_A$) occurs between the temperature $T_A$ ($<T_{amb}$) of the first support member 11 and the temperature $T_B$ ($=T_{amb}$) of the second support member 12. As a rule, the relation $T_2>T_4>T_3>T_1$ is established, where $T_1$ is the temperature in the vicinity of the first surface $21D_1$ of the first thermoelectric conversion member 21D and the first surface $22D_1$ of the second thermoelectric conversion member 22D in contact with the first support member 11, $T_2$ is the temperature in the vicinity of the second surface $21D_2$ of the first thermoelectric conversion member 21D and the second surface $22D_2$ of the second thermoelectric conversion member 22D in contact with the second support member 12, $T_3$ is the temperature in the vicinity of the first surface $23D_1$ of the third thermoelectric conversion member 23D and the first surface $24D_1$ of the fourth thermoelectric conversion member 24D in contact with the first support member 11, and $T_4$ is the temperature in the vicinity of the second surface $23D_2$ of the third thermoelectric conversion member 23D and the second surface $24D_2$ of the fourth thermoelectric conversion member 24D in contact with the second support member 12. The electromotive force $EMF_1$ by a single pair of the first and second thermoelectric conversion elements, and the electromotive force $EMF_2$ by a single pair of the third and fourth thermoelectric conversion elements can be determined as follows.

$$EMF_1 = T_2 \times SB_1 - T_1 \times SB_2$$

$$EMF_2 = T_4 \times SB_3 - T_3 \times SB_4$$

The same is applicable to Examples 6 and 7 below.

EXAMPLE 6

Figure 8A:
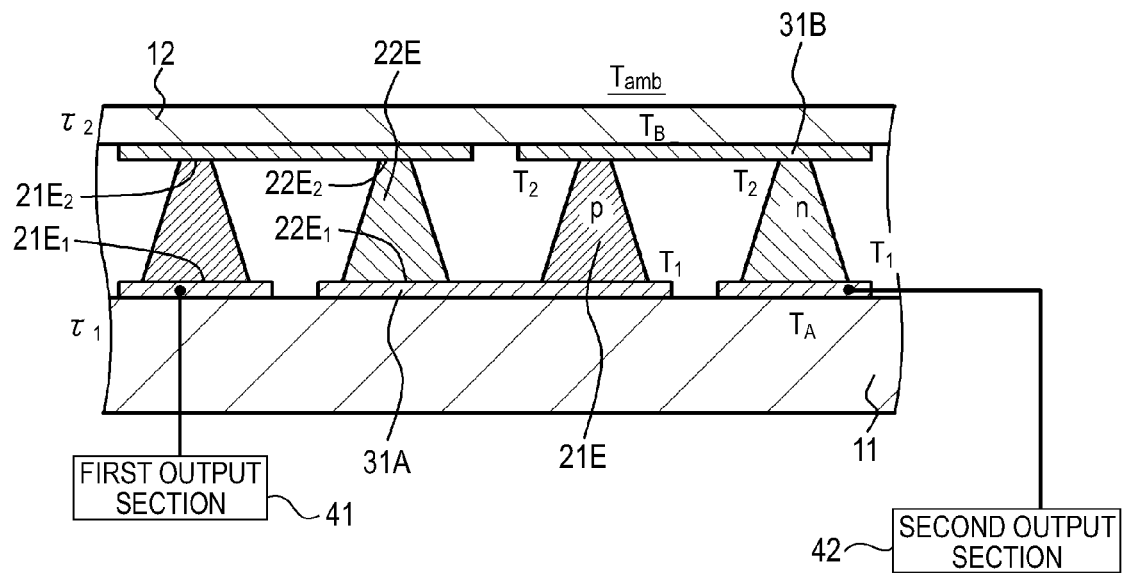
FIGS. 8A and 8B are schematic partial cross sectional views of a thermoelectric generator of Example 6.
Figure 8B:
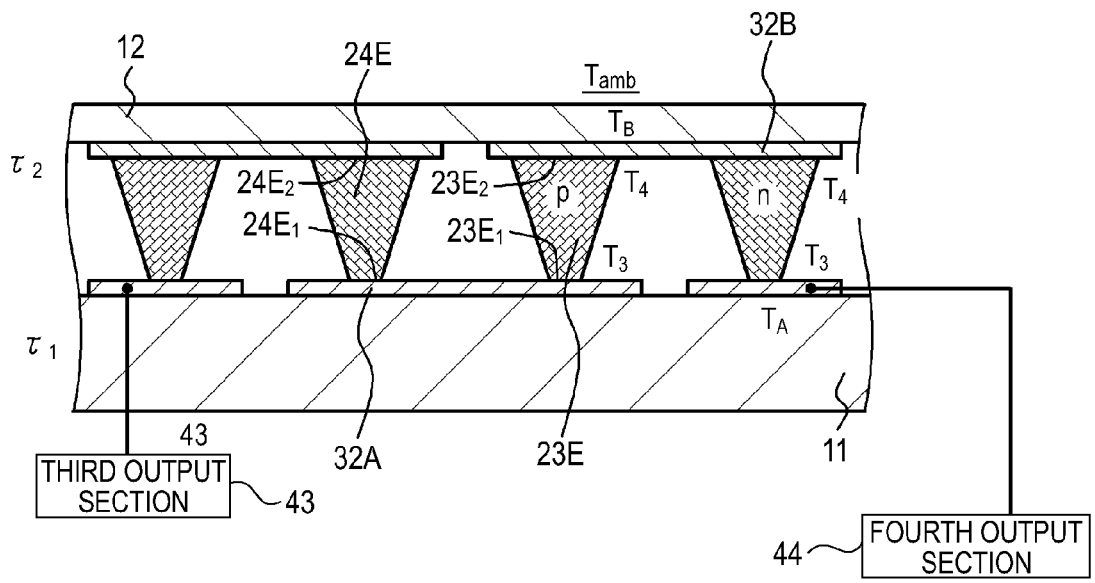
Figure 9:
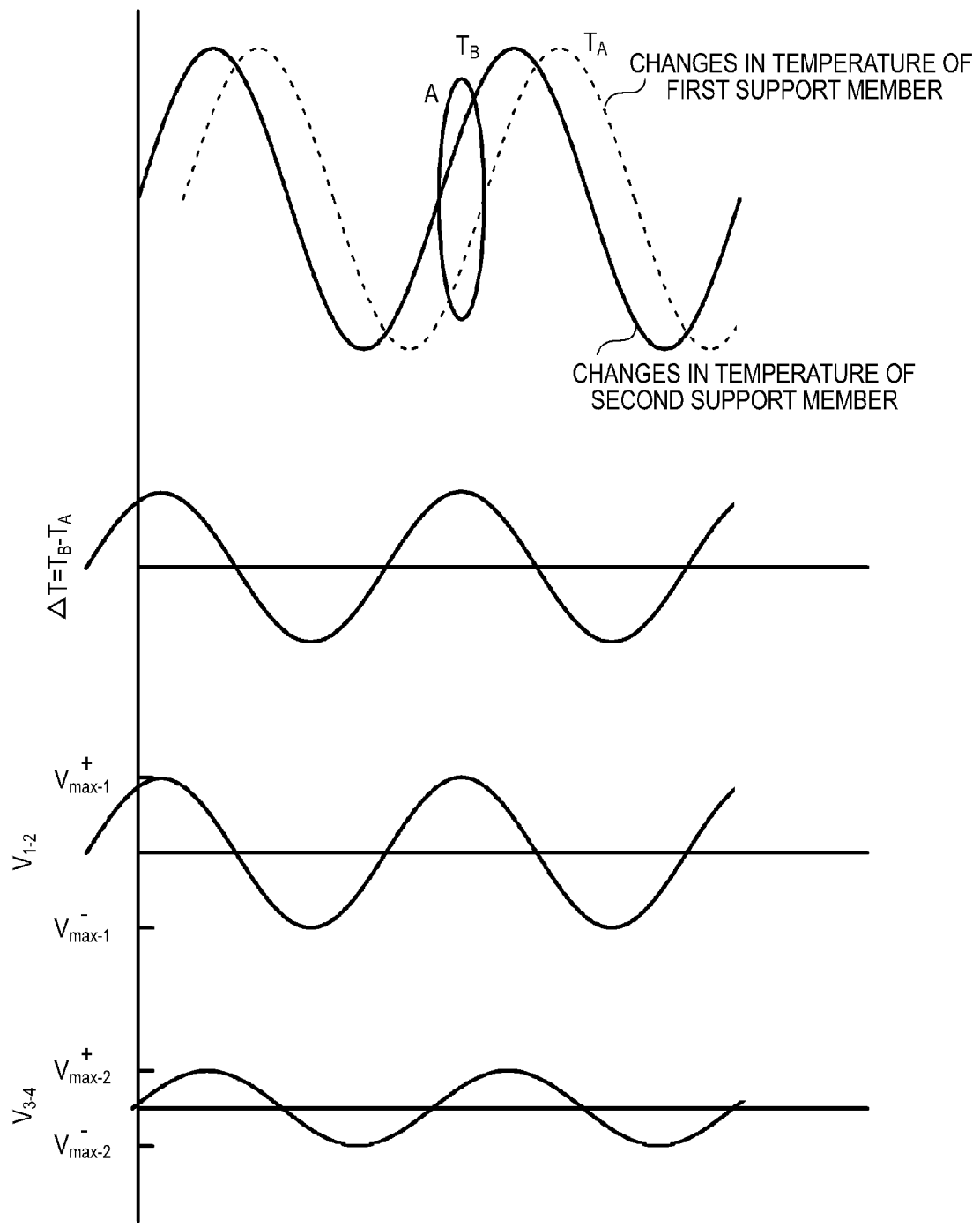
FIG. 9 is a diagram schematizing the temperature ($T_A$) of a first support member and the temperature ($T_B$) of a second support member of Example 6, changes in temperature difference between these temperatures ($\Delta T = T_B - T_A$), changes in voltage $V_{1-2}$ between a first output section and a second output section, and changes in $V_{3-4}$ between a third output section and a fourth output section.

Example 6 concerns the thermoelectric generator according to Fourth Embodiment, and the thermoelectric generation method according to Fourth Embodiment B. FIGS. 8A and 8B are schematic partial cross sectional view of the thermoelectric generator of Example 6. FIG. 9 schematically represents the temperature ($T_A$) of the first support member, and the temperature ($T_B$) of the second support member; changes in temperature difference between these temperatures ($\Delta T=T_B-T_A$); changes in voltage $V_{1-2}$ between the first output section and the second output section; and changes in voltage $V_{3-4}$ between the third output section and the fourth output section.

In the thermoelectric generator of Example 6, as in the thermoelectric generator of Example 5, the first output section 41 is connected to an end portion of the first thermoelectric conversion member 21E on the first support member side, and the second output section 42 to an end portion of the second thermoelectric conversion member 22E on the first support member side. However, the third output section 43 is connected to an end portion of the third thermoelectric conversion member 23E on the first support member side, and the fourth output section 44 is connected to an end portion of the fourth thermoelectric conversion member 24E on the first support member side. In other words, the first output section 41 and the second output section 42, and the third output section 43 and the fourth output section 44 are disposed on the same support member.

In Example 6, the relations $\tau_{SM1} \neq \tau_{SM2}$, and $\tau_{TE1} \neq \tau_{TE2}$ are established, where $\tau_{SM1}$ is the thermal response time constant of the first support member 11, $\tau_{SM2}$ is the thermal response time constant of the second support member 12, $\tau_{TE1}$ is the thermal response time constant of the first thermoelectric conversion element, and $\tau_{TE2}$ is the thermal response time constant of the second thermoelectric conversion element.

In the thermoelectric generation method of Example 6, the thermoelectric generator is placed in a temperature-changing atmosphere. When the temperature of the second support member 12 is higher than the temperature of the first support member 11, the current that is generated due to the temperature difference between the first support member 11 and the second support member 12, and that flows from the second thermoelectric conversion member 22E to the first thermoelectric conversion member 21E is drawn to outside using the first output section 41 as the positive terminal, and the second output section 42 as the negative terminal, and that flows from the fourth thermoelectric conversion member 24E to the third thermoelectric conversion member 23E is drawn to outside using the third output section 43 as the positive terminal, and the fourth output section 44 as the negative terminal. In this case, because alternate current flows between the first output section 41 and the second output section 42 and between the third output section 43 and the fourth output section 44, the alternate current may be converted into direct current using, for example, the full-wave rectifier circuit illustrated in FIG. 17C, followed by smoothing. The full-wave rectifier circuit illustrated in FIG. 17C is also applicable to the other Examples. Note that the phase-1 of the voltage drawn to outside using the first output section 41 and the second output section 42 as the positive and negative terminals, and the phase-2 of the voltage drawn to outside using the third output section 43 and the fourth output section 44 as the positive and negative terminals are out of phase with each other by greater than 0° and less than 180°.

EXAMPLE 7

Figure 10A:
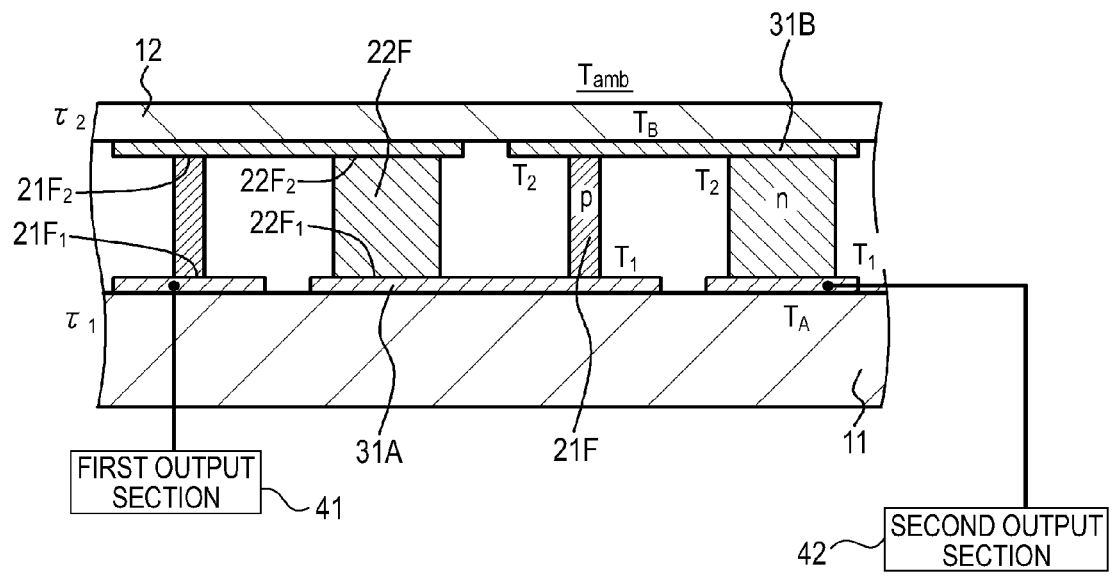
FIGS. 10A and 10B are schematic partial cross sectional views of a thermoelectric generator of Example 7.
Figure 10B:
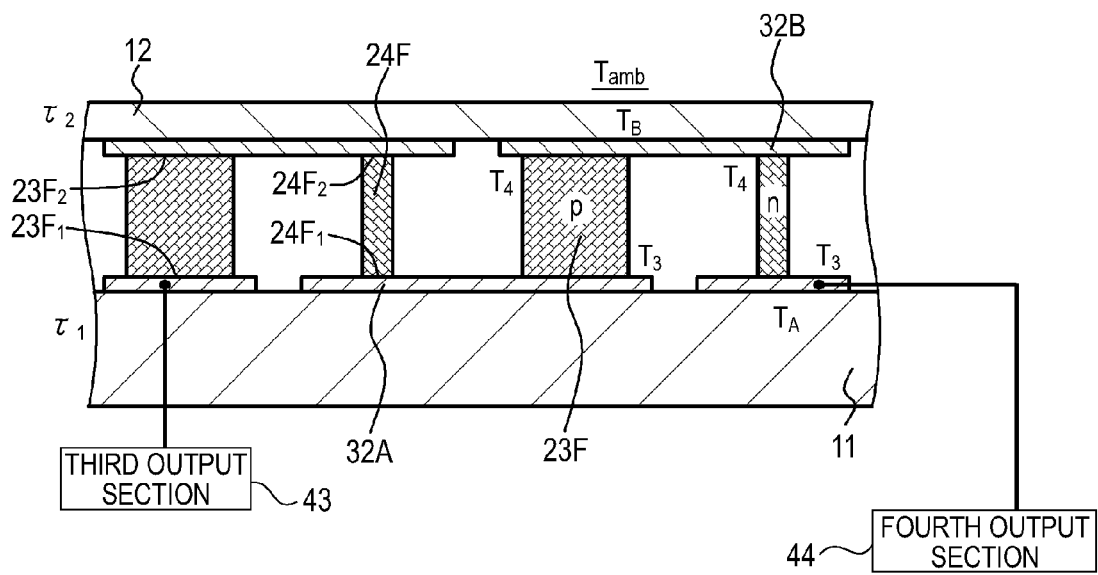
Figure 11:
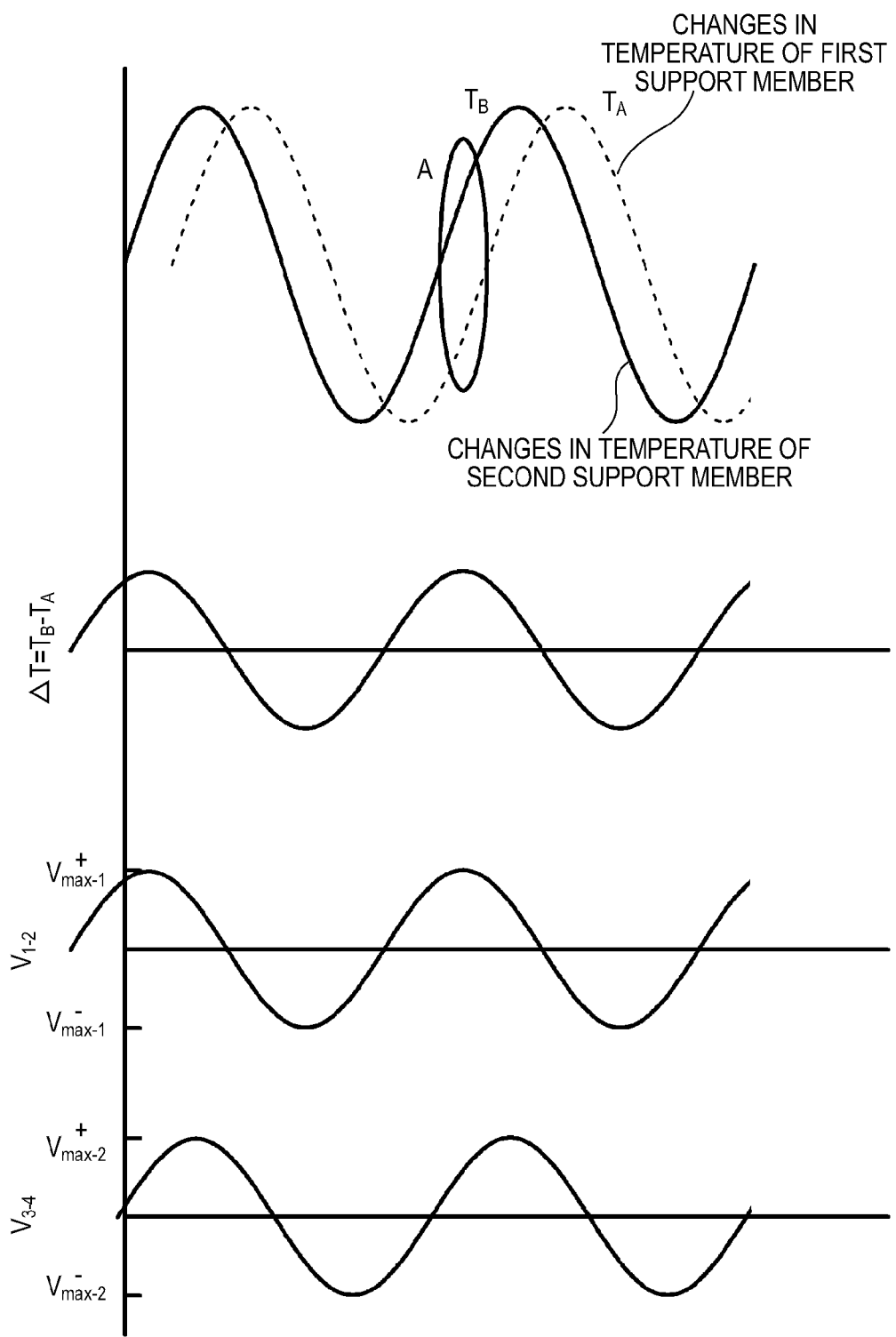
FIG. 11 is a diagram schematizing the temperature ($T_A$) of a first support member and the temperature ($T_B$) of a second support member of Example 7, changes in temperature difference between these temperatures ($\Delta T = T_B - T_A$), changes in voltage $V_{1-2}$ between a first output section and a second output section, and changes in $V_{3-4}$ between a third output section and a fourth output section.

Example 7 is a variation of Example 6. FIGS. 10A and 10B are schematic partial cross sectional views of the thermoelectric generator of Example 7. FIG. 11 schematically represents the temperature ($T_A$) of the first support member, and the temperature ($T_B$) of the second support member; changes in temperature difference between these temperatures ($\Delta T=T_B-T_A$); changes in voltage $V_{1-2}$ between the first output section and the second output section; and changes in voltage $V_{3-4}$ between the third output section and the fourth output section.

In the thermoelectric generator of Example 6, the first thermoelectric conversion member 21E, the second thermoelectric conversion member 22E, the third thermoelectric conversion member 23E, and the fourth thermoelectric conversion member 24E have the shape of truncated quadrangular pyramids. In contrast, in the thermoelectric generator of Example 7, the first thermoelectric conversion member 21F, the second thermoelectric conversion member 22F, the third thermoelectric conversion member 23F, and the fourth thermoelectric conversion member 24F have the shape of quadrangular columns. Further, the relations $VL_1 \neq VL_3$, $VL_2 \neq VL_4$, $VL_1 \neq VL_2$, and $VL_3 \neq VL_4$ are established, where $VL_1$ is the volume of the first thermoelectric conversion member 21, $VL_2$ the volume of the second thermoelectric conversion member 22, $VL_3$ the volume of the third thermoelectric conversion member 23, and $VL_4$ the volume of the fourth thermoelectric conversion member 24. The thermoelectric generator and the thermoelectric generation method of Example 7 are the same as the thermoelectric generator and the thermoelectric generation method of Example 6 except for these points, and thus will not be described in detail.

EXAMPLE 8

Figure 12A:
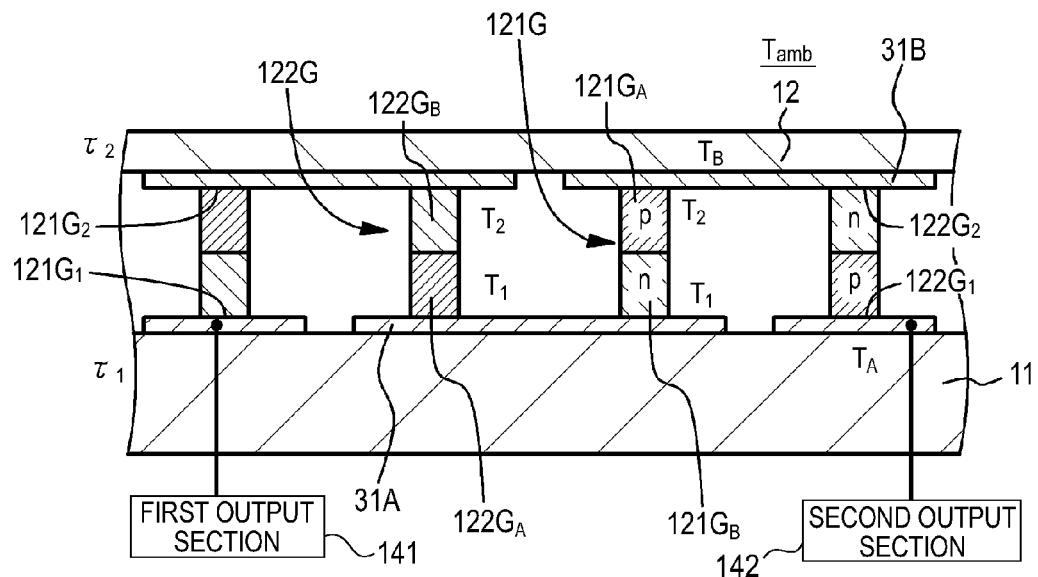
FIGS. 12A and 12B are schematic partial cross sectional views of a thermoelectric generator of Example 8.
Figure 12B:
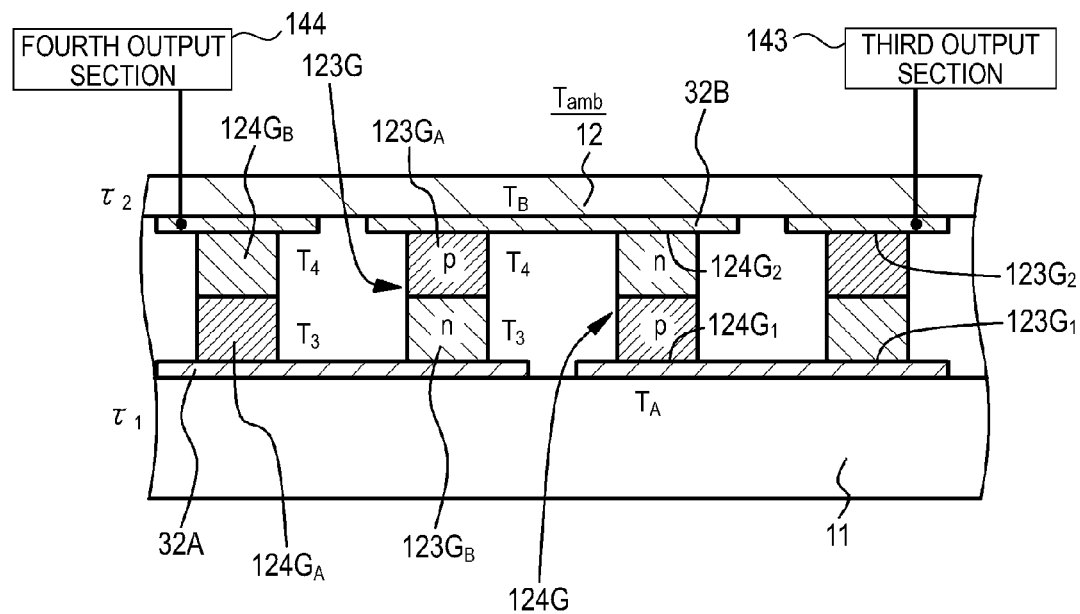
Figure 13:
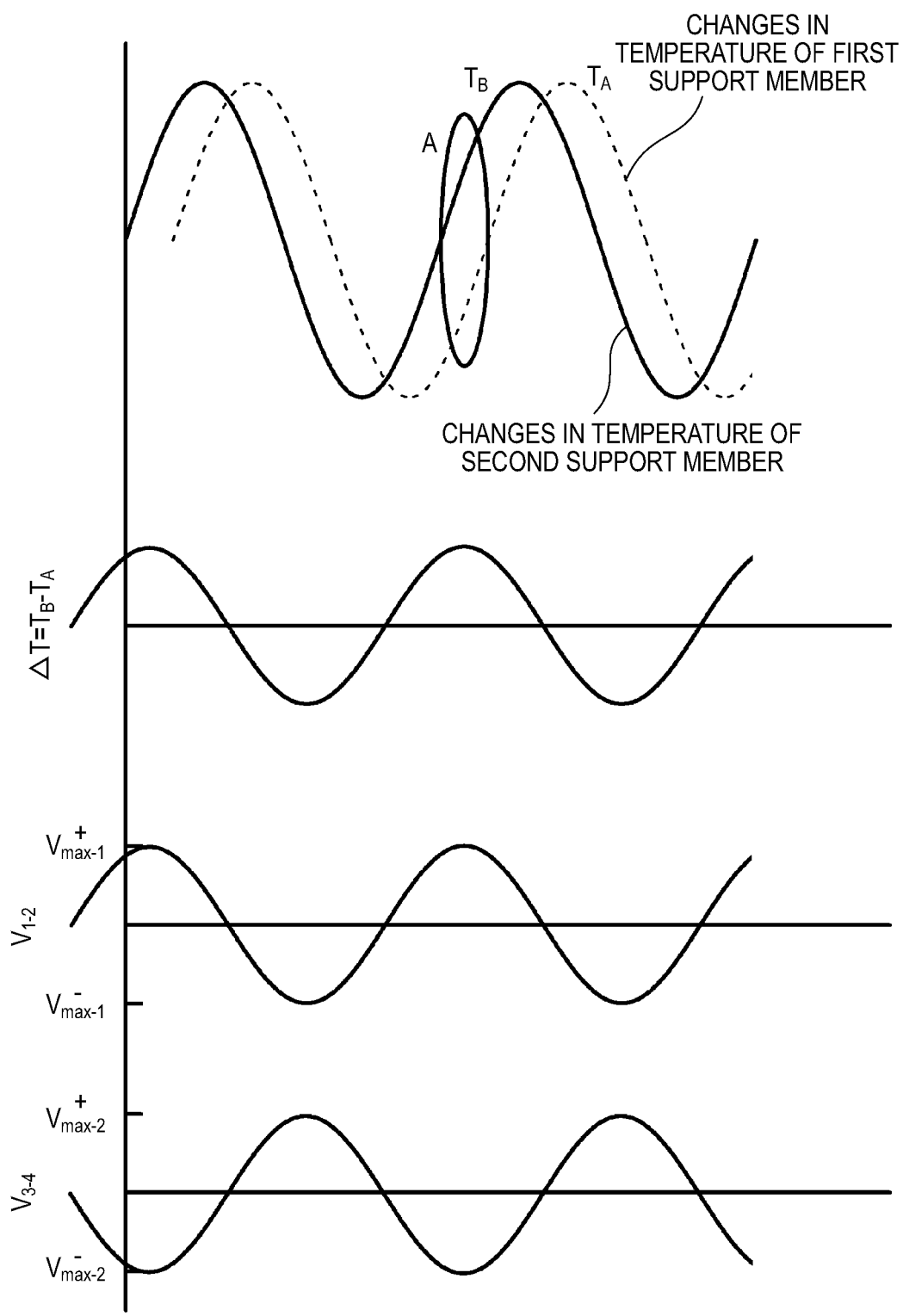
FIG. 13 is a diagram schematizing the temperature ($T_A$) of a first support member and the temperature ($T_B$) of a second support member of Example 8, changes in temperature difference between these temperatures ($\Delta T = T_B - T_A$), changes in voltage $V_{1-2}$ between a first output section and a second output section, and changes in $V_{3-4}$ between a third output section and a fourth output section.

Example 8 concerns the thermoelectric generation method according to Fifth Embodiment A. FIGS. 12A and 12B are schematic partial cross sectional views of a thermoelectric generator suitable for use in the thermoelectric generation method of Example 8. FIG. 13 schematically represents the temperature ($T_A$) of the first support member, and the temperature ($T_B$) of the second support member; changes in temperature difference between these temperatures ($\Delta T=T_B-T_A$); changes in voltage $V_{1-2}$ between the first output section and the second output section; and changes in voltage $V_{3-4}$ between the third output section and the fourth output section.

The thermoelectric generator of Example 8 or Examples 9 and 10 below includes:

(A) a first support member 11;

(B) a second support member 12 disposed opposite the first support member 11;

(C) a first thermoelectric conversion element 121G, 121H, or 121J disposed between the first support member 11 and the second support member 12;

(D) a second thermoelectric conversion element 122G, 122H, or 122J disposed between the first support member 11 and the second support member 12;

(E) a third thermoelectric conversion element 123G, 123H, or 123J disposed between the first support member 11 and the second support member 12;

(F) a fourth thermoelectric conversion element 124G, 124H, or 124J disposed between the first support member 11 and the second support member 12; and (G) a first output section 141, a second output section 142, a third output section 143, and a fourth output section 144.

The first thermoelectric conversion element 121G, 121H, or 121J includes a first thermoelectric conversion member A-121$G_A$, 121H$G_A$, or 121$J_A$ in contact with the second support member 12, and a first thermoelectric conversion member B-121$G_B$, 121H$_B$, or 121$J_B$ in contact with the first support member 11. The first thermoelectric conversion member A-121$G_A$, 121HG$_A$, or 121$J_A$ and the first thermoelectric conversion member B-121$G_B$, 121H$_B$, or 121$J_B$ are disposed in contact with (specifically, laminated with) each other.

The second thermoelectric conversion element 122G, 122H, or 122J includes a second thermoelectric conversion member A-122$G_A$, 122H$_A$, or 122$J_A$ in contact with the first support member 11, and a second thermoelectric conversion member B-122$G_B$, 122H$_B$, or 122$J_B$ in contact with the second support member 12. The second thermoelectric conversion member A-122$G_A$, 122H$_A$, or 122$J_A$ and the second thermoelectric conversion member B-122$G_B$, 122H$_B$, or 122$J_B$ are disposed in contact with (specifically, laminated with) each other.

The third thermoelectric conversion element 123G, 123H, or 123J includes a third thermoelectric conversion member A-123$G_A$, 123H$_A$, or 123$J_A$ in contact with the second support member 12, and a third thermoelectric conversion member B-123$G_B$, 123H$_B$, or 123$J_B$ in contact with the first support member 11. The third thermoelectric conversion member A-123$G_A$, 123H$_A$, or 123$J_A$ and the third thermoelectric conversion member B-123$G_B$, 123H$_B$, or 123$J_B$ are disposed in contact with (specifically, laminated with) each other.

The fourth thermoelectric conversion element 124G, 124H, or 124J includes a fourth thermoelectric conversion member A-124$G_A$, 124H$_A$, or 124$J_A$ in contact with the first support member 11, and a fourth thermoelectric conversion member B-124$G_B$, 124H$_B$, 124$J_B$ in contact with the second support member 12. The fourth thermoelectric conversion member A-124$G_A$, 124H$_A$, or 124$J_A$ and the fourth thermoelectric conversion member B-124$G_B$, 124H$_B$, or 124$J_B$ are disposed in contact with (specifically, laminated with) each other.

The first thermoelectric conversion element 121G, 121H, or 121J and the second thermoelectric conversion element 122G, 122H, or 122J are electrically connected to each other in series. The third thermoelectric conversion element 123G, 123H, or 123J and the fourth thermoelectric conversion element 124G, 124H, or 124J are electrically connected to each other in series. The first output section 141 is connected to the first thermoelectric conversion element 121G, 121H, or 121J. The second output section 142 is connected to the second thermoelectric conversion element 122G, 122H, or 122J. The third output section 143 is connected to the third thermoelectric conversion element 123G, 123H, or 123J. The fourth output section 144 is connected to the fourth thermoelectric conversion element 124G, 124H, or 124J. In other words, the first output section 141 and the second output section 142, and the third output section 143 and the fourth output section 144 are disposed on different support members.

Specifically, in Example 8, the first output section 141 is connected to an end portion of the first thermoelectric conversion member B-121$G_B$, the second output section 142 to an end portion of the second thermoelectric conversion member A-122$G_A$, the third output section 143 to an end portion of the third thermoelectric conversion member A-123$G_A$, and the fourth output section 144 to an end portion of the fourth thermoelectric conversion member B-124$G_B$. More specifically, the first thermoelectric conversion member A-121$G_A$ and the second thermoelectric conversion member B-122$G_B$ are electrically connected to each other via a wire 31B provided on the second support member 12, the second thermoelectric conversion member A-122$G_A$ and the first thermoelectric conversion member B-121$G_B$ are electrically connected to each other via a wire 31A provided on the first support member 11, the third thermoelectric conversion member A-123$G_A$ and the fourth thermoelectric conversion member B-124$G_B$ are electrically connected to each other via a wire 32B provided on the second support member 12, and the fourth thermoelectric conversion member A-124G$_A$ and the third thermoelectric conversion member B-123G$_B$ are electrically connected to each other via a wire 32A provided on the first support member 11.

Further, in Example 8, the relation $\tau_{SM1} \neq \tau_{SM2}$ is established, where $\tau_{SM1}$ is the thermal response time constant of the first support member 11, and $\tau_{SM2}$ is the thermal response time constant of the second support member 12. The first thermoelectric conversion element 121G, the second thermoelectric conversion element 122G, the third thermoelectric conversion element 123G, and the fourth thermoelectric conversion element 124G are columnar in shape, specifically, quadrangular columns.

In the thermoelectric generation method of Example 8, the thermoelectric generator is placed in a temperature-changing atmosphere. When the temperature of the second support member 12 is higher than the temperature of the first support member 11, the current that is generated due to the temperature difference between the first support member 11 and the second support member 12, and that flows from the second thermoelectric conversion element 122G to the first thermoelectric conversion element 121G is drawn to outside using the first output section 141 as the positive terminal, and the second output section 142 as the negative terminal. On the other hand, when the temperature of the first support member 11 is higher than the temperature of the second support member 12, the current that flows due to the temperature difference between the first support member 11 and the second support member 12, and that flows from the third thermoelectric conversion element 123G to the fourth thermoelectric conversion element 124G is drawn to outside using the fourth output section 144 as the positive terminal, and the third output section 143 as the negative terminal. In this case, because alternate current flows between the first output section 141 and the second output section 142 and between the third output section 143 and the fourth output section 144, the alternate current may be converted into direct current using a known half-wave rectifier circuit, followed by smoothing. Note that the phase-1 of the voltage drawn to outside using the first output section 141 and the second output section 142 as the positive and negative terminals, and the phase-2 of the voltage drawn to outside using the third output section 143 and the fourth output section 144 as the negative and positive terminals are out of phase with each other by about 180°. In other words, phase-1 and phase-2 are reversed phases, or substantially reversed phases.

When the temperature of the first support member 11 is higher than the temperature of the second support member 12, the current that is generated due to the temperature difference between the first support member 11 and the second support member 12, and that flows from the first thermoelectric conversion element 121G to the second thermoelectric conversion element 122G can be drawn to outside using the second output section 142 as the positive terminal, and the first output section 141 as the negative terminal. When the temperature of the second support member 12 is higher than the temperature of the first support member 11, the current that flows from the fourth thermoelectric conversion element 124G to the third thermoelectric conversion element 123G can be drawn to outside using the third output section 143 as the positive terminal, and the fourth output section 144 as the negative terminal. In this case, the alternate current may be converted into direct current using a known full-wave rectifier circuit, followed by smoothing. The same is applicable to Examples 9 and 10 below.

When $\tau_{SM1} > \tau_{SM2}$, the temperature $T_B$ of the second support member 12 of the thermoelectric generator placed in a temperature-changing atmosphere (atmospheric temperature $T_{amb}$ at time indicated by ellipsoid A in FIG. 13) quickly becomes the atmospheric temperature $T_{amb}$, or a temperature near $T_{amb}$. On the other hand, because $\tau_{SM1} > \tau_{SM2}$, the temperature $T_A$ of the first support member 11 varies by lagging behind the temperature change of the second support member 12. As a result, a temperature difference $\Delta T$ ($=T_B-T_A$) occurs between the temperature $T_A$ ($<T_{amb}$) of the first support member 11 and the temperature $T_B$ ($=T_{amb}$) of the second support member 12. The relations $T_2 > T_1$, and $T_4 > T_3$ are established, where $T_2$ is the temperature in the vicinity of the second surface 121G$_2$ of the first thermoelectric conversion member A-121G$_A$ and the second surface 122G$_2$ of the second thermoelectric conversion member B-122G$_B$ in contact with the second support member 12, $T_1$ is the temperature in the vicinity of the first surface 121G$_1$ of the first thermoelectric conversion member B-121G$_B$ and the first surface 122G$_1$ of the second thermoelectric conversion member A-122G$_A$ in contact with the first support member 11, $T_4$ is the temperature in the vicinity of the second surface 123G$_2$ of the third thermoelectric conversion member A-123G$_A$ and the second surface 124G$_2$ of the fourth thermoelectric conversion member B-124G$_B$ in contact with the second support member 12, and $T_3$ is the temperature in the vicinity of the first surface 123G$_1$ of the third thermoelectric conversion member B-123G$_B$ and the first surface 124G$_1$ of the fourth thermoelectric conversion member A-124G$_A$ in contact with the first support member 11. The electromotive force $EMF_1$ by a single pair of the first thermoelectric conversion element and the second thermoelectric conversion element, and the electromotive force $EMF_2$ by a single pair of the third thermoelectric conversion element and the fourth thermoelectric conversion element can be determined as follows.

$$EMF_1 = T_2 \times SB_1 - T_1 \times SB_2$$

$$EMF_2 = T_4 \times SB_3 - T_3 \times SB_4$$

EXAMPLE 9

Figure 14A:
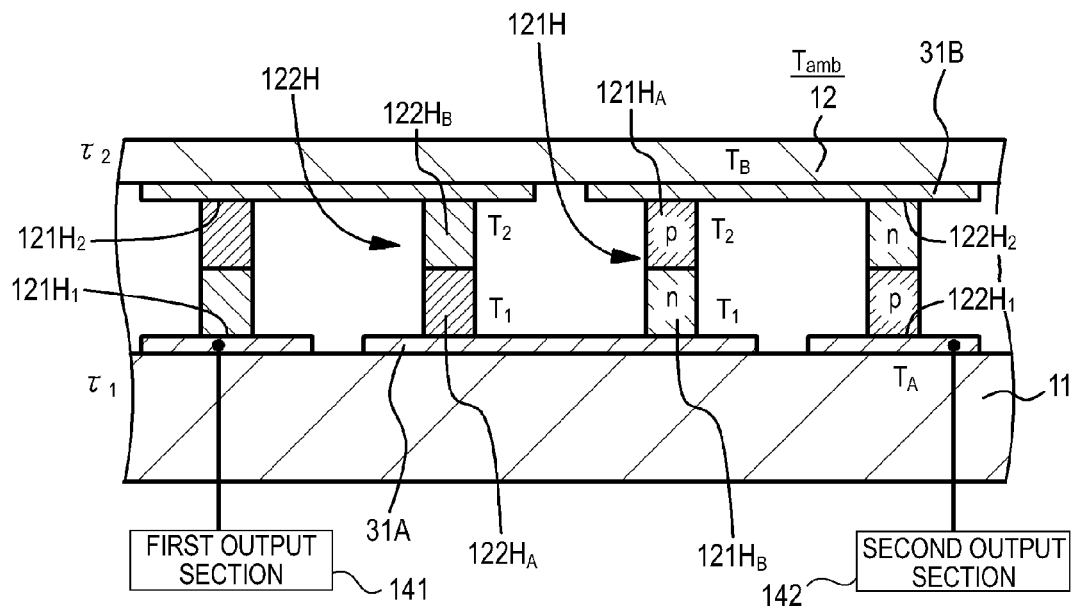
FIGS. 14A and 14B are schematic partial cross sectional views of a thermoelectric generator of Example 9.
Figure 14B:
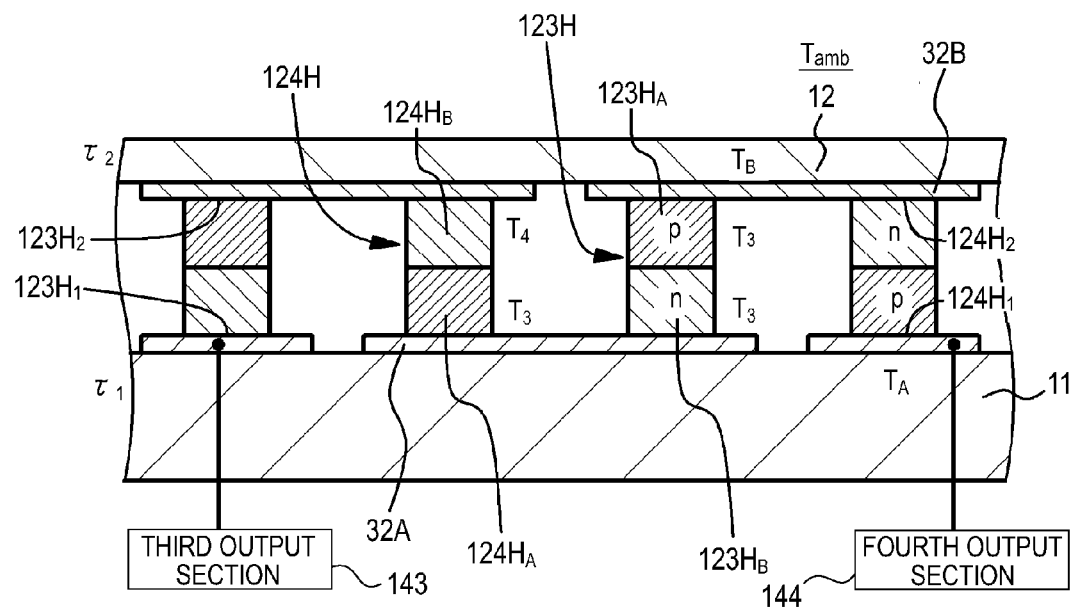
Figure 15:
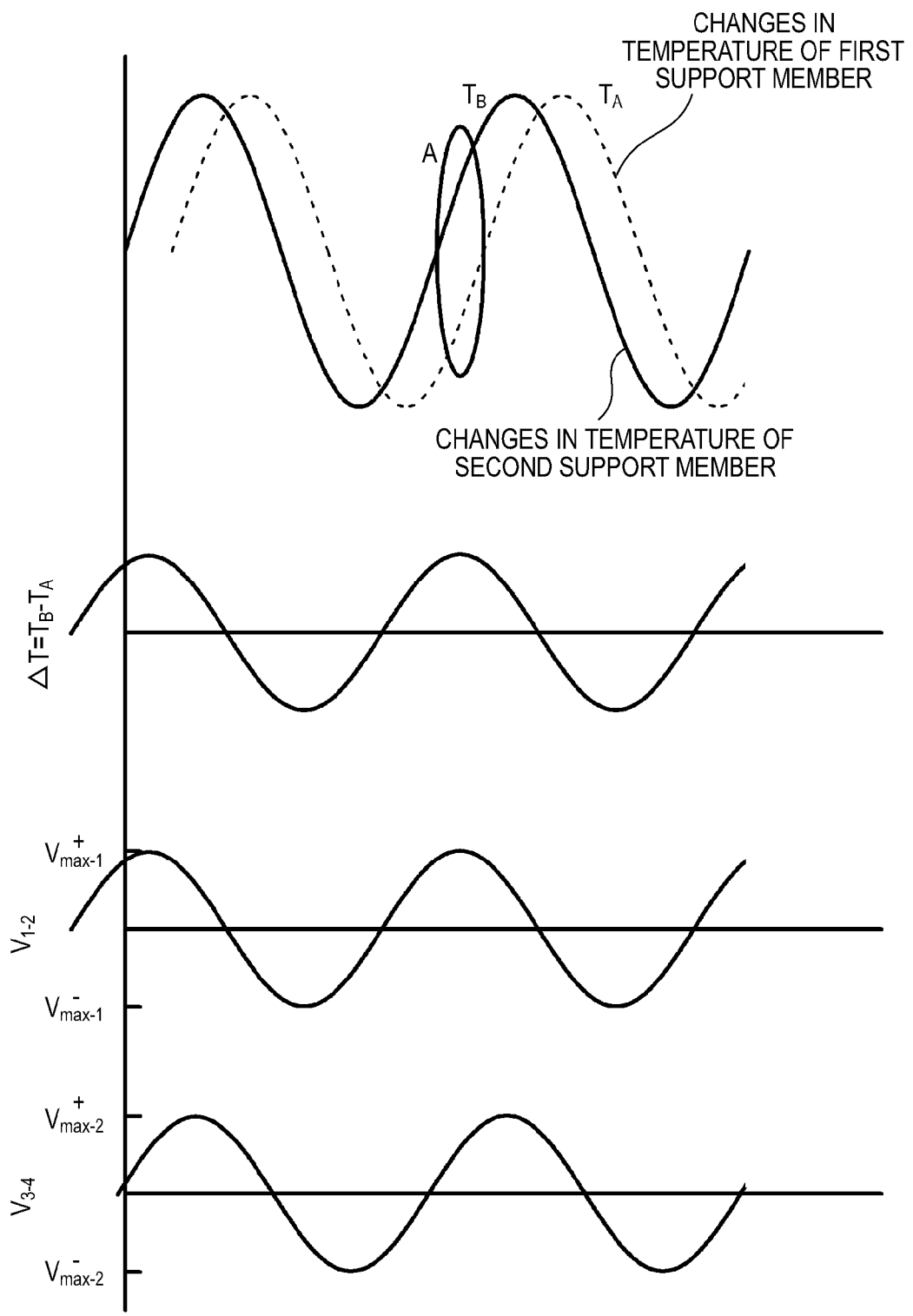
FIG. 15 is a diagram schematizing the temperature ($T_A$) of a first support member and the temperature ($T_B$) of a second support member of Example 9, changes in temperature difference between these temperatures ($\Delta T = T_B - T_A$), changes in voltage $V_{1-2}$ between a first output section and a second output section, and changes in $V_{3-4}$ between a third output section and a fourth output section.

Example 9 concerns the thermoelectric generator according to Fifth Embodiment, and the thermoelectric generation method according to Fifth Embodiment B. FIGS. 14A and 14B are schematic partial cross sectional views of the thermoelectric generator of Example 9. FIG. 15 schematically represents the temperature ($T_A$) of the first support member, and the temperature ($T_B$) of the second support member; changes in temperature difference between these temperatures ($\Delta T = T_B - T_A$); changes in voltage $V_{1-2}$ between the first output section and the second output section; and changes in voltage $V_{3-4}$ between the third output section and the fourth output section.

In Example 9 or Example 10 below, the first output section 141 is connected to an end portion of the first thermoelectric conversion member B-121H$_B$ or 121J$_B$, the second output section 142 is connected to an end portion of the second thermoelectric conversion member A-122H$_A$ or 122J$_A$, the third output section 143 is connected to an end portion of the third thermoelectric conversion member B-123H$_B$ or 123J$_B$, and the fourth output section 144 is connected to an end portion of the fourth thermoelectric conversion member A-124H$_A$ or 124J$_A$. In other words, the first output section 141 and the second output section 142, and the third output section 143 and the fourth output section 144 are disposed on the same support member. The first thermoelectric conversion member A-121H$_A$ or 121J$_A$ and the second thermoelectric conversion member B-122H$_B$ or 122J$_B$ are electrically connected to each other via a wire 31B provided on the second support member 12. The first thermoelectric conversion member B-121H$_B$ or 121J$_B$ and the second thermoelectric conversion member A-122H$_A$ or 122J$_A$ are electrically connected to each other via a wire 31A provided on the first support member 11. The third thermoelectric conversion member A-123H$_A$ or 123J$_A$ and the fourth thermoelectric conversion member B-124H$_B$ or 124J$_B$ are electrically connected to each other via a wire 32B provided on the second support member 12. The third thermoelectric conversion member B-123H$_B$ or 123J$_B$ and the fourth thermoelectric conversion member A-124H$_A$ or 124J$_A$ are electrically connected to each other via a wire 32A provided on the first support member 11.

Further, when $\tau_{SM1}$ is the thermal response time constant of the first support member 11, and $\tau_{SM2}$ is the thermal response time constant of the second support member 12, the relations $\tau_{TE1} \neq \tau_{TE3}$, and $\tau_{TE2} \neq \tau_{TE4}$, are established, where $\tau_{TE1}$ is the thermal response time constant of the first thermoelectric conversion element 121H or 121J, $\tau_{TE2}$ is the thermal response time constant of the second thermoelectric conversion element 122H or 122J, $\tau_{TE3}$ is the thermal response time constant of the third thermoelectric conversion element 123H or 123J, and $\tau_{TE4}$ is the thermal response time constant of the fourth thermoelectric conversion element 124H or 124J. Further, in Example 9, VL$_1$=VL$_2$≠VL$_3$=VL$_4$ (specifically, VL$_1$=VL$_2$<VL$_3$=VL$_4$ in Example 9), where VL$_1$ is the volume of the first thermoelectric conversion element 121H, VL$_2$ the volume of the second thermoelectric conversion element 122H, VL$_3$ the volume of the third thermoelectric conversion element 123H, and VL$_4$ the volume of the fourth thermoelectric conversion element 124H. The first thermoelectric conversion element 121H, the second thermoelectric conversion element 122H, the third thermoelectric conversion element 123H, and the fourth thermoelectric conversion element 124H are columnar in shape, specifically, quadrangular columns.

In the thermoelectric generation method of Example 9, the thermoelectric generator is placed in a temperature-changing atmosphere. When the temperature of the second support member 12 is higher than the temperature of the first support member 11, the current that is generated due to the temperature difference between the first support member 11 and the second support member 12, and that flows from the second thermoelectric conversion element 122H to the first thermoelectric conversion element 121H is drawn to outside using the first output section 141 as the positive terminal, and the second output section 142 as the negative terminal, and that flows from the fourth thermoelectric conversion element 124H to the third thermoelectric conversion element 123H is drawn to outside using the third output section 143 as the positive terminal, and the fourth output section 144 as the negative terminal. In this case, because alternate current flows between the first output section 141 and the second output section 142 and between the third output section 143 and the fourth output section 144, the current may be converted into direct current using a known half-wave rectifier circuit, followed by smoothing. Note that the phase-1 of the voltage drawn to outside using the first output section 141 and the second output section 142 as the positive and negative terminals, respectively, and the phase-2 of the voltage drawn to outside using the third output section 143 and the fourth output section 144 as the positive and negative terminals, respectively, are out of phase with each other by greater than 0° and less than 180°.

When $\tau_{SM1} > \tau_{SM2}$, the temperature T$_B$ of the second support member 12 of the thermoelectric generator placed in a temperature-changing atmosphere (atmospheric temperature T$_{amb}$ at time indicated by ellipsoid A in FIG. 15) quickly becomes the atmospheric temperature T$_{amb}$, or a temperature near T$_{amb}$. On the other hand, because $\tau_{SM1} > \tau_{SM2}$, the temperature T$_A$ of the first support member 11 varies by lagging behind the temperature change of the second support member 12. As a result, a temperature difference ΔT (=T$_B$−T$_A$) occurs between the temperature T$_A$ (<T$_{amb}$) of the first support member 11 and the temperature T$_B$ (=T$_{amb}$) of the second support member 12. The relations T$_2$>T$_1$, and T$_4$>T$_3$ are established, where T$_2$ is the temperature in the vicinity of the second surface 121H$_2$ of the first thermoelectric conversion member A-121H$_A$ and the second surface 122H$_2$ of the second thermoelectric conversion member B-122H$_B$ in contact with the second support member 12, T$_1$ is the temperature in the vicinity of the first surface 121H$_1$ of the first thermoelectric conversion member A-121H$_A$ and the first surface 122H$_1$ of the second thermoelectric conversion member B-122H$_B$ in contact with the first support member 11, T$_4$ is the temperature in the vicinity of the second surface 123H$_2$ of the third thermoelectric conversion member A-123H$_A$ and the second surface 124H$_2$ of the fourth thermoelectric conversion member B-124H$_B$ in contact with the second support member 12, and T$_3$ is the temperature in the vicinity of the first surface 123H$_1$ of the third thermoelectric conversion member A-123H$_A$ and the first surface 124H$_1$ of the fourth thermoelectric conversion member B-124H$_B$ in contact with the first support member 11. The electromotive force EMF$_1$ by a single pair of the first thermoelectric conversion element and the second thermoelectric conversion element, and the electromotive force EMF$_2$ by a single pair of the third thermoelectric conversion element and the fourth thermoelectric conversion element can be determined as follows.

$$EMF_1 = T_2 \times SB_1 - T_1 \times SB_2$$

$$EMF_2 = T_4 \times SB_3 - T_3 \times SB_4$$

EXAMPLE 10

Figure 16A:
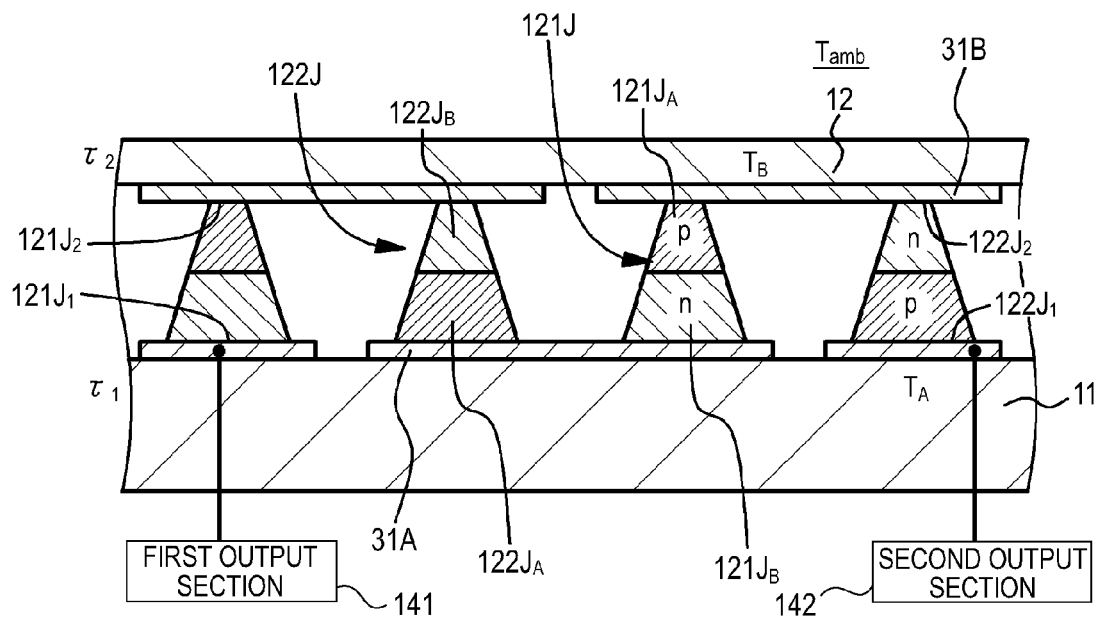
FIGS. 16A and 16B are schematic partial cross sectional views of a thermoelectric generator of Example 10.
Figure 16B:
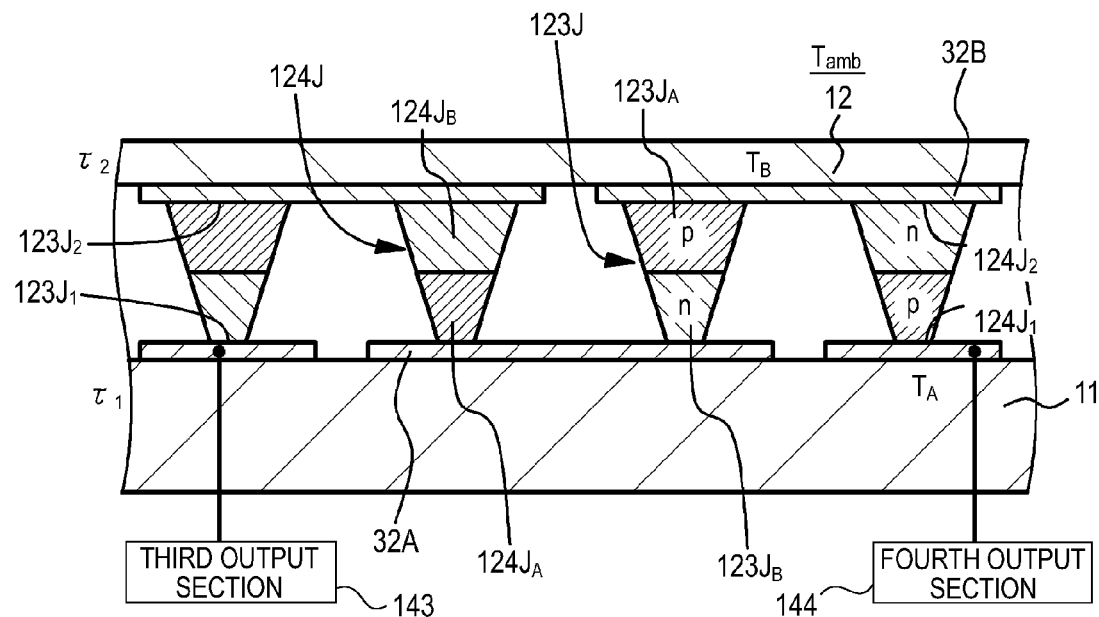

Example 10 is a variation of Example 9. FIGS. 16A and 16B are schematic partial cross sectional views of the thermoelectric generator of Example 10.

In the thermoelectric generator of Example 9, the first thermoelectric conversion element 121H, the second thermoelectric conversion element 122H, the third thermoelectric conversion element 123H, and the fourth thermoelectric conversion element 124H have the shape of quadrangular columns. In contrast, in the thermoelectric generator of Example 10, the first thermoelectric conversion element 121J, the second thermoelectric conversion element 122J, the third thermoelectric conversion element 123J, and the fourth thermoelectric conversion element 124J have the shape of truncated quadrangular pyramids. Specifically, the relations S$_{12}$≠S$_{32}$, and S$_{21}$≠S$_{41}$, and the relations S$_{12}$≠S$_{21}$, and S$_{31}$≠S$_{42}$ are established, where S$_{12}$ is the area of the first thermoelectric conversion member A-121J$_A$ in a portion (second surface 121J$_2$) in contact with the second support member 12, S$_{22}$ is the area of the second thermoelectric conversion member B-122J$_B$ in a portion (second surface 122J$_2$) in contact with the second support member 12, S$_{11}$ is the area of the first thermoelectric conversion member B-121J$_B$ in a portion (first surface 121J$_{11}$) in contact with the first support member 11, S$_{21}$ is the area of the second thermoelectric conversion member A-122J$_A$ in a portion (first surface 122J$_1$) in contact with the first support member 11, S$_{32}$ is the area of the third thermoelectric conversion member A-123J$_A$ in a portion (second surface 123J$_2$) in contact with the second support member 12, $S_{42}$ is the area of the fourth thermoelectric conversion member B-124J$_B$ in a portion (second surface 124J$_2$) in contact with the second support member 12, $S_{31}$ is the area of the third thermoelectric conversion member B-123J$_B$ in a portion (first surface 123J$_1$) in contact with the first support member 11, and $S_{41}$ is the area of the fourth thermoelectric conversion member A-124J$_A$ in a portion (first surface 124J$_1$) in contact with the first support member 11. The thermoelectric generator, and the thermoelectric generation method of Example 10 can be configured in the same way as the thermoelectric generator, and the thermoelectric generation method of Example 9 except for these points, and thus will not be described in detail.

EXAMPLE 11

In Example 11, power was supplied to a digital humidity sensor module (Mother Tool Co., LTD.: Model MT-160) via a voltage multiplier circuit and a boost circuit (Seiko Instruments Inc.: boost DC-DC converter-starting ultra-low voltage operation charge pump IC S-882Z18), using a thermoelectric generator of substantially the same structure as that described in Example 2. The temperature-changing atmosphere of the thermoelectric generator was as follows:

$\Delta T_{amb}$: about 4.5° C.

Temperature change cycle TM: 15 min

Air wind speed: about 1 msec

The thermoelectric generator placed in this atmosphere produced a maximum voltage of 750 millivolts, and an average power of 44.2 microwatts/200 cm$^2$ was obtained during 15 hours of thermoelectric generation. It was therefore possible to supply the required voltage and power of 1 volt and 4.5 microwatts specified for the operation of the digital humidity sensor module.

EXAMPLE 12

Example 12 concerns the electrical signal detecting method according to First Embodiment, and the electrical signal detecting device according to an embodiment. The electrical signal detecting method of Example 12 is an electrical signal detecting method that uses an electrical signal detecting device produced by using the thermoelectric generator according to First Embodiment described in Example 1. In the electrical signal detecting method of Example 12, the thermoelectric generator is also placed in a temperature-changing atmosphere. Essentially as in Example 1, when the temperature of the second support member 12 is higher than the temperature of the first support member 11, the current that is generated due to the temperature difference between the first support member 11 and the second support member 12, and that flows from the second thermoelectric conversion member 22A or 22B to the first thermoelectric conversion member 21A or 21B is drawn to outside as an electrical signal, using the first output section 41 as the positive terminal (plus terminal), and the second output section 42 as the negative terminal (minus terminal). In contrast to Example 1 in which the current that flows from the second thermoelectric conversion member 22A or 22B to the first thermoelectric conversion member 21A or 21B is used as energy source, in Example 12, the current that flows from the second thermoelectric conversion member 22A or 22B to the first thermoelectric conversion member 21A or 21B is used as electrical signal, specifically, an electrical signal that conveys information. Different kinds of electrical signals are obtained from this electrical signal.

For example, there is a correlation between the biological information human heart rate and body temperature. The agreed increment of heart rate per 1° C. of body temperature is 8 beats/° C. to 10 beats/° C. Body temperature also fluctuates according to such factors as stress, consciousness level, and clinical conditions. It is therefore possible to monitor biological information such as pulse, stress level, consciousness level, and clinical conditions by sensing temperature information (absolute temperature, relative temperature, fluctuation cycle) through electrical signal detection. Further, because the electrical signal detecting device used is produced from the thermoelectric generator, the monitoring may involve thermoelectric generation. Specifically, the current that flows from the second thermoelectric conversion member 22A or 22B to the first thermoelectric conversion member 21A or 21B can be used not only as an electrical signal, specifically an information-conveying electrical signal, but as an energy source. The thermoelectric energy may be temporarily stored in a capacitor or a secondary battery, and then brought to other uses (for example, the energy source of the measurement device represented in FIG. 17D).

In the electrical signal detecting method of Example 12, the generated power is due to the temperature difference between ambient temperature and subject temperature (for example, body temperature), when, for example, one of the temperature contacts is the measurement face, and when the other temperature contact is the atmosphere. In this case, the electrical signal (output signal) becomes the composite wave of electromotive forces due to not only the ambient temperature fluctuation cycle and fluctuation range, but the subject temperature (for example, body temperature) fluctuation cycle and fluctuation range. The type of the detected electrical signal according to the temperature fluctuation cycle becomes different for, for example, stress level, and the fluctuation of body temperature due to movement. Thus, the electrical signal is the composite signal of these and other electrical signals. Thus, the electrical signal (for convenience, "pre-process electrical signal") is obtained based on the current that flows from the second thermoelectric conversion member 22A or 22B to the first thermoelectric conversion member 21A or 21B. The electrical signal (pre-process electrical signal) can then be subjected to post-processes, for example, such as frequency analysis, to obtain different kinds of electrical signals (for convenience, "post-process electrical signals").

For example, the post-process uses a hidden Markov model. Specifically, a temperature signal model of characteristic patterns contained in a predetermined cycle or in a certain signal intensity is acquired, for example, as a signal unit that independently occurs in each constituting element/various factors, or as a signal that has a correlation with a plurality of constituting elements/a plurality of factors at the same time, and that originates in a specific factor. Here, the periodicity obtained specific to each of the thermoelectric conversion elements of different thermal time constants in the image of a tuning fork is utilized. Specifically, in the presence of cyclic temperature fluctuations of a certain temperature fluctuation range, a signal from a thermoelectric conversion element that produces the output with the smallest loss from among the thermoelectric conversion elements of different thermal time constants over this temperature fluctuation range is extracted. Frequency decomposition is made possible only by this procedure, without the need for complex arithmetic processes. Basically, the same process can be used also for the composite wave of different signals. The enablement of such processes is advantageous, for example, in reducing the number of operations for the input waveforms of considerably different sampling cycles of sufficient accuracy in, for example, FFT (Fast Fourier/Cosine/Sine Transform) spectral analysis. This is because each thermoelectric conversion element has its own frequency of specialty, and thus enables a sufficient sampling cycle to be set beforehand for the spectral analysis. When the thermoelectric conversion elements all have the same thermal time constant, FFT spectral analysis will be necessary, or the spectral analysis may be used alone even when thermal time constants are different. In the model extraction, a characteristic state is extracted by a pre-process, which may be, for example, PCA (Principal Components Analysis) or ICA (Independent Component Analysis). A probability density function concerning the extracted state is then determined, and a state transition model is created. The state transition model may be created for each of the thermoelectric conversion elements of different thermal time constants. For the pre-process electrical signal, a state transition path that yields the best probability score for the output series is selected using, for example, a Viterbi algorithm, and the post-process electrical signal can be obtained upon optimum path tracking. The optimum path tracking may be performed for each of the thermoelectric conversion elements of different thermal time constants. The same post-process may be performed in Examples 13 to 18 below.

Specifically, for example, the extraction of a body temperature fluctuation cycle from an electrical signal that contains the ambient temperature fluctuation cycle and the body temperature fluctuation cycle is preceded by feature extraction for the ambient fluctuation model and the body temperature fluctuation model as state transition models based on PCA or ICA. Here, temperature data for, for example, ambient temperature fluctuation can be acquired based on common convective heat transfer/radiative heat transfer. In contrast, temperature data for the body temperature can be acquired based on heat conduction or radiation. Because the skin has larger heat capacity than air, skin temperature fluctuations lag behind the ambient temperature fluctuation. The ambient temperature fluctuation has a relatively short cycle, and the signal easily fluctuates. In the case of radiative heat transfer, the thermoelectric conversion element involves different emissivities, different configuration factors, and different absorption spectra for the surroundings and the body. A plurality of state transition models results from these different data acquisition methods, the heat capacity of the subject, emissivity and other material properties, and differences in constant such as the configuration factor. By determining the probability density distribution according to the situation of each state transition model acquired beforehand, state determination can be made by optimum path tracking in actual monitoring. The stress level extracted from the electrical signal that contains the ambient temperature fluctuation cycle and stress level is determined from a combination of a plurality of signals, specifically, skin surface temperature, sweat level, heart rate, and pulse. The signals for the heart rate and pulse can be obtained from body temperature measurement. Considering that the heat-transfer coefficient on the skin surface varies by sweating, the signal for the sweat level can be obtained from temperature measurement. The signals originate from different sources, and thus their cycles do not match, provided that the sampling cycles are sufficient. This enables signal extraction by frequency decomposition that uses the characteristic frequency of the thermoelectric conversion element, or by other techniques such as FFT and spectral analysis. Feature extraction is then performed based on PCA or ICA for each of the signals, and upon acquisition of state transition models, a probability density distribution is determined according to the situation of each model. State determination is made by optimum path tracking in actual monitoring. The same is applicable to Examples 13 to 18 below.

The electrical signal detecting device of Example 12 operates based on these principles. Specifically, the electrical signal detecting device of Example 12 includes at least two of the thermoelectric generators according to First to Fifth Embodiments described in Examples 1 to 10, and the current obtained from each thermoelectric generator is obtained as an electrical signal. By the provision of at least two of the thermoelectric generators according to First to Fifth Embodiments described in Examples 1 to 10, detection of information (electrical signal) not possible with an electrical signal detecting device provided with only one thermoelectric generator, or detection of more than one information item (electrical signal) is enabled. Specifically, for example, by combining the thermoelectric generators described in Examples 1 and 4, an electrical signal detecting device can be realized that includes a thermoelectric generator suited for measuring blood pressure, and a thermoelectric generator suited for measuring heart rate. The electrical signal detecting device also serves as a thermoelectric generator. As required, the resulting electrical signal may be passed through a bandpass filter, a lowpass filter, or a highpass filter. The electrical signal detecting device of Example 12 is also applicable to Examples 13 to 18 below.

As described above, the thermal response time constant $\tau$ is determined by the density $\rho$, specific heat c, and heat-transfer coefficient h of the materials forming the support member, the thermoelectric conversion element, and the thermoelectric conversion member, and the volume VL and area S of the support member, the thermoelectric conversion element, and the thermoelectric conversion member. Thus, desired information (electrical signal) can be obtained by appropriately selecting these variables. In this way, an electrical signal detecting device can be obtained that includes thermoelectric generators of different thermal response time constants $\tau$. Because of the difference in thermal response with respect to temperature changes, a plurality of electrical signals can be obtained from the electrical signal detecting device, and thus more than one information item can be obtained from the single electrical signal detecting device. Typical heart rate of humans is about 50 to 90 for adults, and about 50 to 100 for children. For example, thermal response time constant $\tau$ may be 0.1 to 5, preferably 1 to 3. For blood pressure fluctuation, thermal response time constant $\tau$ may be, for example, 10 to 60 for signals in an active state, and may be 3 to 6 for signals in a breathing state.

EXAMPLE 13

Example 13 is the electrical signal detecting method according to Second Embodiment. The electrical signal detecting method of Example 13 is an electrical signal detecting method that uses the thermoelectric generator according to Second Embodiment described in Example 2. In Example 13, the thermoelectric generator is placed in a temperature-changing atmosphere, as in Example 3. Further, essentially as in Example 3, when the temperature of the second support member 12 is higher than the temperature of the first support member 11, the current that is generated due to the temperature difference between the first support member 11 and the second support member 12, and that flows from the second thermoelectric conversion member 22A or 22B to the first thermoelectric conversion member 21A or 21B is drawn to outside as electrical signal, using the first output section 41 as the positive terminal (plus terminal), and the second output section 42 as the negative terminal (minus terminal). Further, as in Example 12, different kinds of electrical signals (post-process electrical signals) are obtained from the electrical signal (pre-process electrical signal).

EXAMPLE 14

Example 14 is the electrical signal detecting method according to Third Embodiment. The electrical signal detecting method of Example 14 is an electrical signal detecting method that uses the thermoelectric generator according to Third Embodiment described in Examples 3 and 4. In Example 14, as in Examples 3 and 4, the thermoelectric generator is placed in a temperature-changing atmosphere. Further, essentially as in Examples 3 and 4, when the temperature of the second support member 12 or 212 is higher than the temperature of the first support member 11 or 211, the current that is generated due to the temperature difference between the first support member 11 or 211 and the second support member 12 or 212, and that flows from the second thermoelectric conversion element 122C or 222C to the first thermoelectric conversion element 121C or 221C is drawn to outside as an electrical signal, using the first output section 141 or 241 as the positive terminal, and the second output section 142 or 242 as the negative terminal. Further, as in Example 12, different kinds of electrical signals (post-process electrical signals) are obtained from the electrical signal (pre-process electrical signal).

EXAMPLE 15

Example 15 is the electrical signal detecting method according to Fourth Embodiment A. The electrical signal detecting method of Example 15 is an electrical signal detecting method that uses the thermoelectric generator according to Fourth Embodiment described in Example 5. In Example 15, as in Example 5, the thermoelectric generator is placed in a temperature-changing atmosphere. Further, essentially as in Example 5, when the temperature of the second support member 12 is higher than the temperature of the first support member 11, the current that is generated due to the temperature difference between the first support member 11 and the second support member 12, and that flows from the second thermoelectric conversion member 22D to the first thermoelectric conversion member 21D is drawn to outside as an electrical signal, using the first output section 41 as the positive terminal, and the second output section 42 as the negative terminal. On the other hand, when the temperature of the first support member 11 is higher than the temperature of the second support member 12, the current that is generated due to the temperature difference between the first support member 11 and the second support member 12, and that flows from the fourth thermoelectric conversion member 24D to the third thermoelectric conversion member 23D is drawn to outside as an electrical signal, using the third output section 43 as the positive terminal, and the fourth output section 44 as the negative terminal. Further, as in Example 12, different kinds of electrical signals (post-process electrical signals) are obtained from the electrical signal (pre-process electrical signal).

EXAMPLE 16

Example 16 is the electrical signal detecting method according to Fourth Embodiment B. The electrical signal detecting method of Example 16 is an electrical signal detecting method that uses the thermoelectric generator according to Fourth Embodiment described in Examples 6 and 7. In Example 16, as in Examples 6 and 7, the thermoelectric generator is placed in a temperature-changing atmosphere. Further, essentially as in Examples 6 and 7, when the temperature of the second support member 12 is higher than the temperature of the first support member 11, the current that is generated due to the temperature difference between the first support member 11 and the second support member 12, and that flows from the second thermoelectric conversion members 22E and 22F to the first thermoelectric conversion members 21E and 21F is drawn to outside as an electrical signal, using the first output section 41 as the positive terminal, and the second output section 42 as the negative terminal, and that flows from the fourth thermoelectric conversion members 24E and 24F to the third thermoelectric conversion members 23E and 23F is drawn to outside as an electrical signal, using the third output section 43 as the positive terminal, and the fourth output section 44 as the negative terminal. Further, as in Example 12, different kinds of electrical signals (post-process electrical signals) are obtained from the electrical signal (pre-process electrical signal).

EXAMPLE 17

Example 17 is the electrical signal detecting method according to Fifth Embodiment A. The electrical signal detecting method of Example 17 is an electrical signal detecting method that uses the thermoelectric generator according to Fifth Embodiment described in Example 8. In Example 17, as in Example 8, the thermoelectric generator is placed in a temperature-changing atmosphere. Further, essentially as in Example 8, when the temperature of the second support member 12 is higher than the temperature of the first support member 11, the current that is generated due to the temperature difference between the first support member 11 and the second support member 12, and that flows from the second thermoelectric conversion element 122G to the first thermoelectric conversion element 121G is drawn to outside as an electrical signal, using the first output section 141 as the positive terminal, and the second output section 142 as the negative terminal. On the other hand, when the temperature of the first support member 11 is higher than the temperature of the second support member 12, the current that is generated due to the temperature difference between the first support member 11 and the second support member 12, and the flows from the third thermoelectric conversion element 123G to the fourth thermoelectric conversion element 124G is drawn to outside as an electrical signal, using the fourth output section 144 as the positive terminal, and the third output section 143 as the negative terminal. Further, as in Example 12, different kinds of electrical signals (post-process electrical signals) are obtained from the electrical signal (pre-process electrical signal).

EXAMPLE 18

Example 18 is the electrical signal detecting method according to Fifth Embodiment B. The electrical signal detecting method of Example 18 is an electrical signal detecting method that uses the thermoelectric generator according to Fifth Embodiment described in Examples 9 and 10. In Example 18, as in Examples 9 and 10, the thermoelectric generator is placed in a temperature-changing atmosphere. Further, essentially as in Examples 9 and 10, when the temperature of the second support member 12 is higher than the temperature of the first support member 11, the current that is generated due to the temperature difference between the first support member 11 and the second support member 12, and that flows from the second thermoelectric conversion element 122H or 122J to the first thermoelectric conversion element 121H or 121J is drawn to outside as an electrical signal, using the first output section 141 as the positive terminal, and the second output section 142 as the negative terminal, and that flows from the fourth thermoelectric conversion element 124H or 124J to the third thermoelectric conversion element 123H or 123J is drawn to outside as an electrical signal, using the third output section 143 as the positive terminal, and the fourth output section 144 as the negative terminal. Further, as in Example 12, different kinds of electrical signals (post-process electrical signals) are obtained from the electrical signal (pre-process electrical signal).

The structures and configurations of the thermoelectric generators described in the Examples, and variables such as the material and size presented above are merely examples, and may be appropriately changed. For example, instead of using the p-type conductivity elements bismuth.tellurium.antimony for the first thermoelectric conversion member, the third thermoelectric conversion member, the first thermoelectric conversion member A, the second thermoelectric conversion member A, the third thermoelectric conversion member A, and the fourth thermoelectric conversion member A, materials such as $Mg_2Si$, $SrTiO_3$, $MnSi_2$, Si—Ge-based material, $\beta$-$FeSi_2$, PbTe-based material, ZnSb-based material, CoSb-based material, Si-based material, clathrate compounds, $NaCO_2O_4$, $Ca_3CO_4O_9$, and Chromel alloys may be used. Further, instead of using the n-type conductivity elements bismuth.tellurium for the second thermoelectric conversion member, the fourth thermoelectric conversion member, the first thermoelectric conversion member B, the second thermoelectric conversion member B, the third thermoelectric conversion member B, and the fourth thermoelectric conversion member B, materials such as $Mg_2Si$, $SrTiO_3$, $MnSi_2$, Si—Ge-based material, $\beta$-$FeSi_2$, PbTe-based material, ZnSb-based material, CoSb-based material, Si-based material, clathrate compounds, constantan, and Alumel alloys may be used. Further, the structure of the first thermoelectric conversion element or the second thermoelectric conversion element of Example 10 may be applied to the thermoelectric conversion element of Example 3. Further, the configuration and structure of the thermoelectric conversion element described in Example 4 may be applied to the thermoelectric conversion elements described in Examples 8 and 9.

For example, the thermoelectric generators according to First to Fifth Embodiments may be adapted to include a third support member attached to the second support member using a freely stretchable elastic material (for example, silicone rubber) of superior heat conductivity. In this way, the thermal response time constants $\tau$ of the whole generator, including the second support member, the elastic material, and the third support member, vary by the stretch and contraction of the elastic material. This changes the output electrical signal, and thus enables detection of the movement of the third support member relative to the second support member. Specifically, for example, a part of the generator including the first support member and the second support member may be attached to a certain part of the arm while the third support member is attached to some other part of the arm. In this way, changes in position of different parts of the arm (for example, the bent and stretched states of the arm) can be detected. Further, the electrical signal detecting device of an embodiment may be attached to machines or constructions. In this way, any abnormality can be detected upon detection of an electrical signal different from the electrical signal that is based on a cyclic temperature change created in the machine or construction. Such detection can be used as an alternate means of, for example, the procedure that finds abnormalities based on the noise of a hammer struck on a machine or construction.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A thermoelectric generation method using a thermoelectric generator that includes
    (A) a first support member;
    (B) a second support member disposed opposite the first support member;
    (C) a first thermoelectric conversion element disposed between the first support member and the second support member;
    (D) a second thermoelectric conversion element disposed between the first support member and the second support member; and
    (E) a first output section, a second output section, a third output section, and a fourth output section,
    wherein the first thermoelectric conversion element includes
    (C-1) a first thermoelectric conversion member disposed between the first support member and the second support member; and
    (C-2) a second thermoelectric conversion member disposed between the first support member and the second support member, and that is made of a material having a different conductivity type from that of the first thermoelectric conversion member, and is electrically connected in series to the first thermoelectric conversion member,
    the first and second thermoelectric conversion members having a tapering shape that increases from the second support member side to the first support member side,
    the second thermoelectric conversion element includes
    (D-1) a third thermoelectric conversion member disposed between the first support member and the second support member; and
    (D-2) a fourth thermoelectric conversion member disposed between the first support member and the second support member, and that is made of a material having a different conductivity type from that of the third thermoelectric conversion member, and is electrically connected in series to the third thermoelectric conversion member,
    the third and fourth thermoelectric conversion members having a tapering shape that decreases from the second support member side to the first support member side,
    the first output section is connected to the first thermoelectric conversion member,
    the second output section is connected to the second thermoelectric conversion member,
    the third output section is connected to the third thermoelectric conversion member,
    the fourth output section is connected to the fourth thermoelectric conversion member, and a relation $\tau_{SM1} \neq \tau_{SM2}$ is established, where $\tau_{SM1}$ is the thermal response time constant of the first support member, and $\tau_{SM2}$ is the thermal response time constant of the second support member, the method comprising:

placing the thermoelectric generator in a temperature-changing atmosphere;

drawing to outside during a first time period a current that is generated due to a temperature difference between the first support member and the second support member when the temperature of the second support member is higher than the temperature of the first support member, and that flows from the second thermoelectric conversion member to the first thermoelectric conversion member, using the first output section as a positive terminal, and the second output section as a negative terminal; and drawing to outside during a second time period a current that is generated due to a temperature difference between the first support member and the second support member when the temperature of the first support member is higher than the temperature of the second support member, and that flows from the fourth thermoelectric conversion member to the third thermoelectric conversion member, using the third output section as a positive terminal, and the fourth output section as a negative terminal.

2. The method according to claim 1, wherein, in the thermoelectric generator, the first output section is connected to an end portion of the first thermoelectric conversion member on the first support member side, the second output section is connected to an end portion of the second thermoelectric conversion member on the first support member side, the third output section is connected to an end portion of the third thermoelectric conversion member on the second support member side, and the fourth output section is connected to an end portion of the fourth thermoelectric conversion member on the second support member side.

3. The method according to claim 1, wherein the current that is generated due to the temperature difference between the first support member and the second support member during the first time period when the temperature of the second support member is higher than the temperature of the first support member, and that flows from the second thermoelectric conversion member to the first thermoelectric conversion member is drawn to outside using the first output section as a positive terminal, and the second output section as a negative terminal, and the current that flows from the fourth thermoelectric conversion member to the third thermoelectric conversion member is drawn to outside using the third output section as a positive terminal, and the fourth output section as a negative terminal, instead of drawing to outside the current that is generated due to the temperature difference between the first support member and the second support member during the first time period when the temperature of the second support member is higher than the temperature of the first support member, and that flows from the second thermoelectric conversion member to the first thermoelectric conversion member, using the first output section as a positive terminal, and the second output section as a negative terminal, and instead of drawing to outside the current that is generated due to the temperature difference between the first support member and the second support member during the second time period when the temperature of the first support member is higher than the temperature of the second support member, and that flows from the fourth thermoelectric conversion member to the third thermoelectric conversion member, using the third output section as a positive terminal, and the fourth output section as a negative terminal.

4. The method according to claim 3, wherein, in the thermoelectric generator, the first output section is connected to an end portion of the first thermoelectric conversion member on the first support member side, the second output section is connected to an end portion of the second thermoelectric conversion member on the first support member side, the third output section is connected to an end portion of the third thermoelectric conversion member on the first support member side, and the fourth output section is connected to an end portion of the fourth thermoelectric conversion member on the first support member side.

5. The method according to claim 3, wherein, in the thermoelectric generator, a relation $\tau_{TE1} \neq \tau_{TE2}$ is established, where $\tau_{TE1}$ is the thermal response time constant of the first thermoelectric conversion element, and $\tau_{TE2}$ is the thermal response time constant of the second thermoelectric conversion element.

\* \* \* \* \*